US012672572B2

(12) United States Patent　　　(10) Patent No.: US 12,672,572 B2
Buot et al.　　　　　　　　　　　(45) Date of Patent: Jun. 30, 2026

(54) PACKAGE COMPRISING A SUBSTRATE WITH INTERCONNECTS

(71) Applicant: QUALCOMM Incorporated, San Diego, CA (US)

(72) Inventors: Joan Rey Villarba Buot, Escondido, CA (US); Hong Bok We, San Diego, CA (US); Michelle Yejin Kim, Carlsbad, CA (US); Aniket Patil, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 756 days.

(21) Appl. No.: 17/951,601

(22) Filed: Sep. 23, 2022

(65) Prior Publication Data

US 2024/0105568 A1　　Mar. 28, 2024

(51) Int. Cl.
| | |
|---|---|
| *H01L 23/498* | (2006.01) |
| *H01L 23/00* | (2006.01) |
| *H01L 25/16* | (2023.01) |
| *H10W 70/05* | (2026.01) |
| *H10W 70/65* | (2026.01) |
| *H10W 70/685* | (2026.01) |
| *H10W 70/69* | (2026.01) |
| *H10W 90/00* | (2026.01) |

(52) U.S. Cl.
CPC ......... *H10W 70/685* (2026.01); *H10W 70/05* (2026.01); *H10W 70/095* (2026.01); *H10W 70/65* (2026.01); *H10W 70/69* (2026.01); *H10W 90/00* (2026.01); *H10W 90/701* (2026.01); *H10W 90/724* (2026.01)

(58) Field of Classification Search
CPC ..... H10W 70/00; H10W 70/60; H10W 70/67; H10W 70/692; H10W 70/69; H10W 70/63; H10W 70/635; H10W 70/685; H10W 70/05; H10W 20/222; H10W 20/20; H10W 20/00; H10W 20/42; H10W 90/401
See application file for complete search history.

(56) References Cited

U.S. PATENT DOCUMENTS

| | | | | |
|---|---|---|---|---|
| 2008/0237884 | A1* | 10/2008 | Hsu ...................... | H05K 1/0271 |
| | | | | 257/774 |
| 2010/0147574 | A1* | 6/2010 | Kaneko ................... | H01L 25/16 |
| | | | | 29/850 |

(Continued)

FOREIGN PATENT DOCUMENTS

| | | | |
|---|---|---|---|
| CN | 1525533 | A * | 9/2004 |
| EP | 3716320 | A1 | 9/2020 |

OTHER PUBLICATIONS

International Search Report and Written Opinion—PCT/US2023/071771—ISA/EPO—Nov. 6, 2023.

*Primary Examiner* — Lawrence C Tynes, Jr.
(74) *Attorney, Agent, or Firm* — Loza & Loza, LLP

(57) ABSTRACT

A package comprising a substrate and an integrated device coupled to the substrate. The substrate includes a first dielectric layer, a second dielectric layer, a third dielectric layer, and a plurality of interconnects located in the first dielectric layer, the second dielectric layer and the third dielectric layer. The second dielectric layer is located between the first dielectric layer and the third dielectric layer. The second dielectric layer includes a different material than the first dielectric layer and the third dielectric layer.

25 Claims, 12 Drawing Sheets

*CROSS SECTIONAL PROFILE VIEW*

(56) References Cited

U.S. PATENT DOCUMENTS

| | | | | |
|---|---|---|---|---|
| 2014/0093999 | A1* | 4/2014 | Teh | H01L 23/3121 |
| | | | | 438/107 |
| 2020/0273785 | A1* | 8/2020 | Mok | H01L 25/00 |
| 2020/0312767 | A1* | 10/2020 | Pietambaram | H01L 23/481 |
| 2022/0059442 | A1* | 2/2022 | Oh | H10P 72/74 |
| 2022/0068662 | A1* | 3/2022 | Fang | H01L 21/4857 |
| 2022/0320022 | A1* | 10/2022 | Kuo | H01Q 1/52 |
| 2022/0328391 | A1* | 10/2022 | Hu | H10W 70/685 |

* cited by examiner

CROSS SECTIONAL PROFILE VIEW

CROSS SECTIONAL PROFILE VIEW

M1 LAYER OF SUBSTRATE

120

302

304

300

102

*PLAN VIEW*

CROSS SECTIONAL PROFILE VIEW

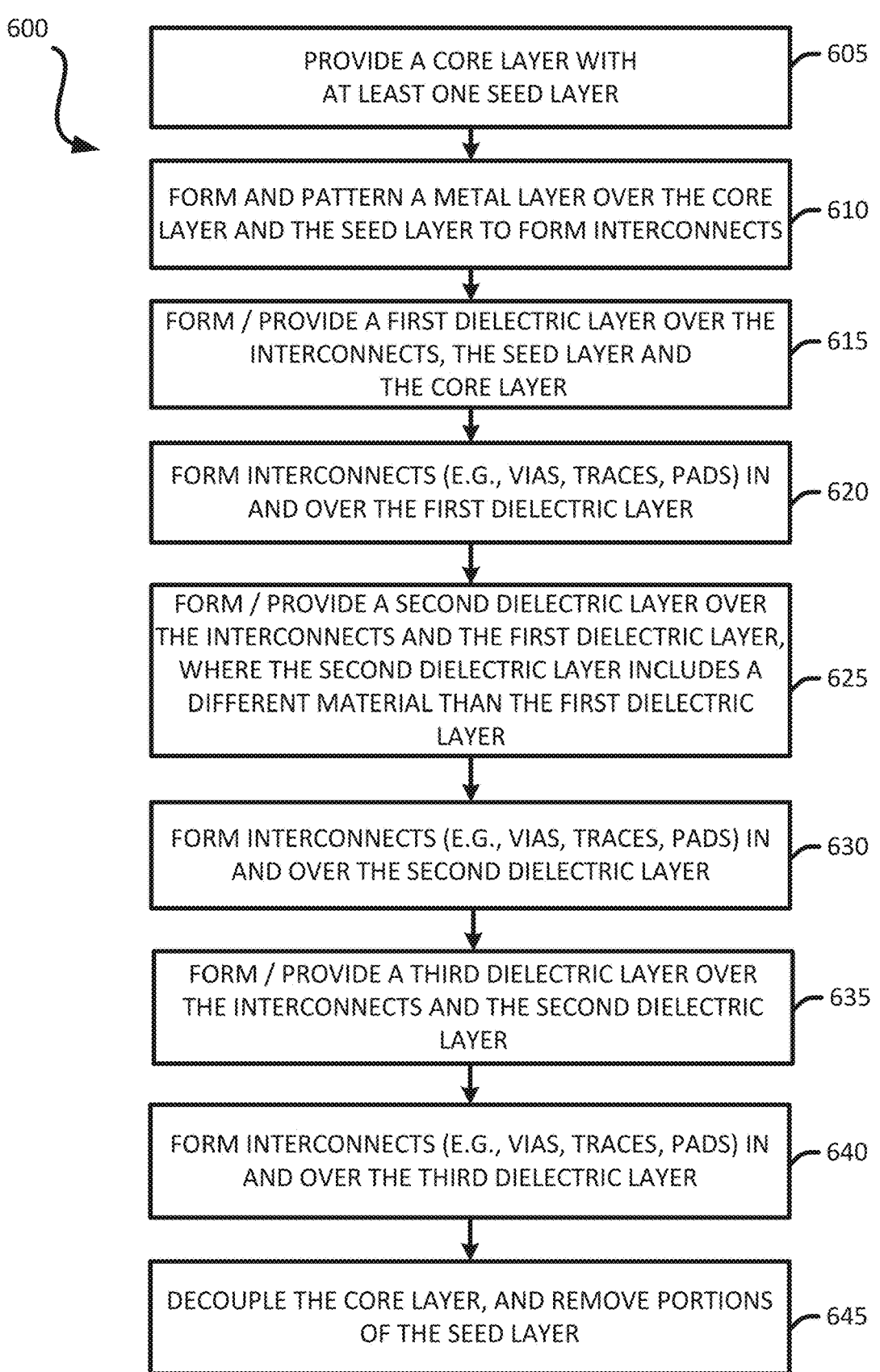

600

605 — PROVIDE A CORE LAYER WITH
AT LEAST ONE SEED LAYER

610 — FORM AND PATTERN A METAL LAYER OVER THE CORE
LAYER AND THE SEED LAYER TO FORM INTERCONNECTS

615 — FORM / PROVIDE A FIRST DIELECTRIC LAYER OVER THE
INTERCONNECTS, THE SEED LAYER AND
THE CORE LAYER

620 — FORM INTERCONNECTS (E.G., VIAS, TRACES, PADS) IN
AND OVER THE FIRST DIELECTRIC LAYER

625 — FORM / PROVIDE A SECOND DIELECTRIC LAYER OVER
THE INTERCONNECTS AND THE FIRST DIELECTRIC LAYER,
WHERE THE SECOND DIELECTRIC LAYER INCLUDES A
DIFFERENT MATERIAL THAN THE FIRST DIELECTRIC
LAYER

630 — FORM INTERCONNECTS (E.G., VIAS, TRACES, PADS) IN
AND OVER THE SECOND DIELECTRIC LAYER

635 — FORM / PROVIDE A THIRD DIELECTRIC LAYER OVER
THE INTERCONNECTS AND THE SECOND DIELECTRIC
LAYER

640 — FORM INTERCONNECTS (E.G., VIAS, TRACES, PADS) IN
AND OVER THE THIRD DIELECTRIC LAYER

645 — DECOUPLE THE CORE LAYER, AND REMOVE PORTIONS
OF THE SEED LAYER

*FIG. 6*

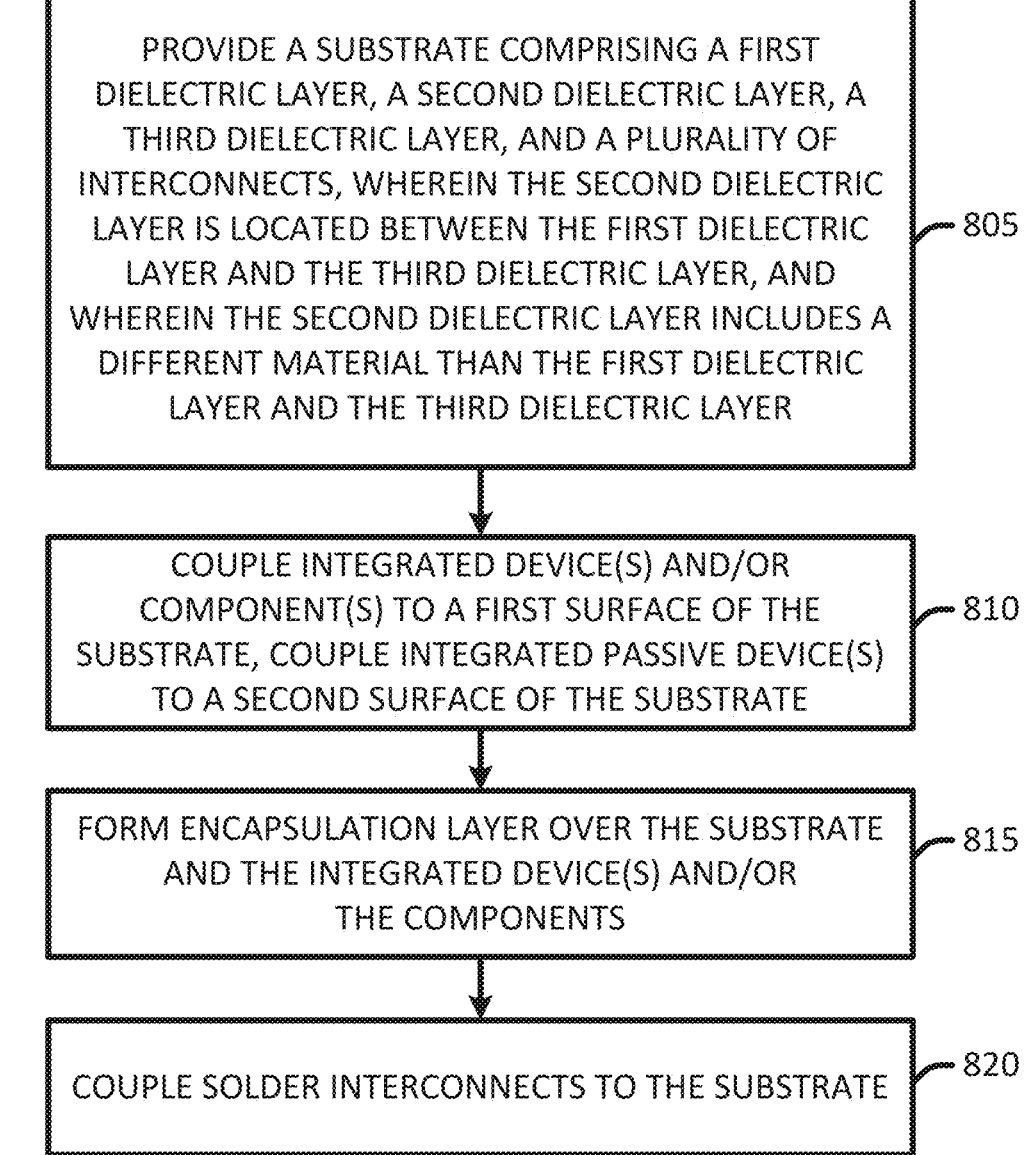

800

PROVIDE A SUBSTRATE COMPRISING A FIRST DIELECTRIC LAYER, A SECOND DIELECTRIC LAYER, A THIRD DIELECTRIC LAYER, AND A PLURALITY OF INTERCONNECTS, WHEREIN THE SECOND DIELECTRIC LAYER IS LOCATED BETWEEN THE FIRST DIELECTRIC LAYER AND THE THIRD DIELECTRIC LAYER, AND WHEREIN THE SECOND DIELECTRIC LAYER INCLUDES A DIFFERENT MATERIAL THAN THE FIRST DIELECTRIC LAYER AND THE THIRD DIELECTRIC LAYER — 805

COUPLE INTEGRATED DEVICE(S) AND/OR COMPONENT(S) TO A FIRST SURFACE OF THE SUBSTRATE, COUPLE INTEGRATED PASSIVE DEVICE(S) TO A SECOND SURFACE OF THE SUBSTRATE — 810

FORM ENCAPSULATION LAYER OVER THE SUBSTRATE AND THE INTEGRATED DEVICE(S) AND/OR THE COMPONENTS — 815

COUPLE SOLDER INTERCONNECTS TO THE SUBSTRATE — 820

*FIG. 8*

PACKAGE COMPRISING A SUBSTRATE WITH INTERCONNECTS

FIELD

Various features relate to packages with a substrate and integrated device.

BACKGROUND

A package may include a substrate and integrated devices. These components are coupled together to provide a package that may perform various functions. The performance of a package and its components may depend on how these components are coupled together. There is an ongoing need to have a package that includes a more compact form factor with improved connections so that the package may be implemented in smaller devices and provided improved performances.

SUMMARY

Various features relate to packages with a substrate and integrated device.

One example provides a package comprising a substrate and an integrated device coupled to the substrate. The substrate includes a first dielectric layer, a second dielectric layer, a third dielectric layer, and a plurality of interconnects located in the first dielectric layer, the second dielectric layer and the third dielectric layer. The second dielectric layer is located between the first dielectric layer and the third dielectric layer. The second dielectric layer includes a different material than the first dielectric layer and the third dielectric layer.

Another example provides a substrate comprising a first dielectric layer, a second dielectric layer and a third dielectric layer, and a plurality of interconnects located in the first dielectric layer, the second dielectric layer and the third dielectric layer. The second dielectric layer is located between the first dielectric layer and the third dielectric layer. The second dielectric layer includes a different material than the first dielectric layer and the third dielectric layer.

Another example provides a method for fabricating a package. The method provides a substrate comprising a first dielectric layer, a second dielectric layer; a third dielectric layer, and a plurality of interconnects located in the first dielectric layer, the second dielectric layer and the third dielectric layer. The second dielectric layer is located between the first dielectric layer and the third dielectric layer. The second dielectric layer includes a different material than the first dielectric layer and the third dielectric layer. The method couples an integrated device to the substrate.

BRIEF DESCRIPTION OF THE DRAWINGS

Various features, nature and advantages may become apparent from the detailed description set forth below when taken in conjunction with the drawings in which like reference characters identify correspondingly throughout.

FIG. 6 illustrates an exemplary flow diagram of a method for fabricating a package comprising a substrate with different dielectric layers.

FIG. 8 illustrates an exemplary flow diagram of a method for fabricating a package comprising a substrate, an integrated device and a passive device.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a package comprising a substrate and an integrated device coupled to the substrate. The substrate includes a first dielectric layer, a second dielectric layer, a third dielectric layer, and a plurality of interconnects located in the first dielectric layer, the second dielectric layer and the third dielectric layer. The second dielectric layer is located between the first dielectric layer and the third dielectric layer. The second dielectric layer includes a different material than the first dielectric layer and the third dielectric layer. In some implementations, the second dielectric layer is free of a glass material and the first dielectric layer and/or the third dielectric layer includes a glass material. In some implementations, the first dielectric layer and/or the third dielectric layer includes prepreg. The use of dielectric layers with different materials for different layers helps provide interconnects with smaller spacing and/or smaller pitch, potentially allowing for higher density interconnects, shorter electrical paths for currents and/or signals, which can lead to improved performances for the integrated device and the package.

Figure 1:
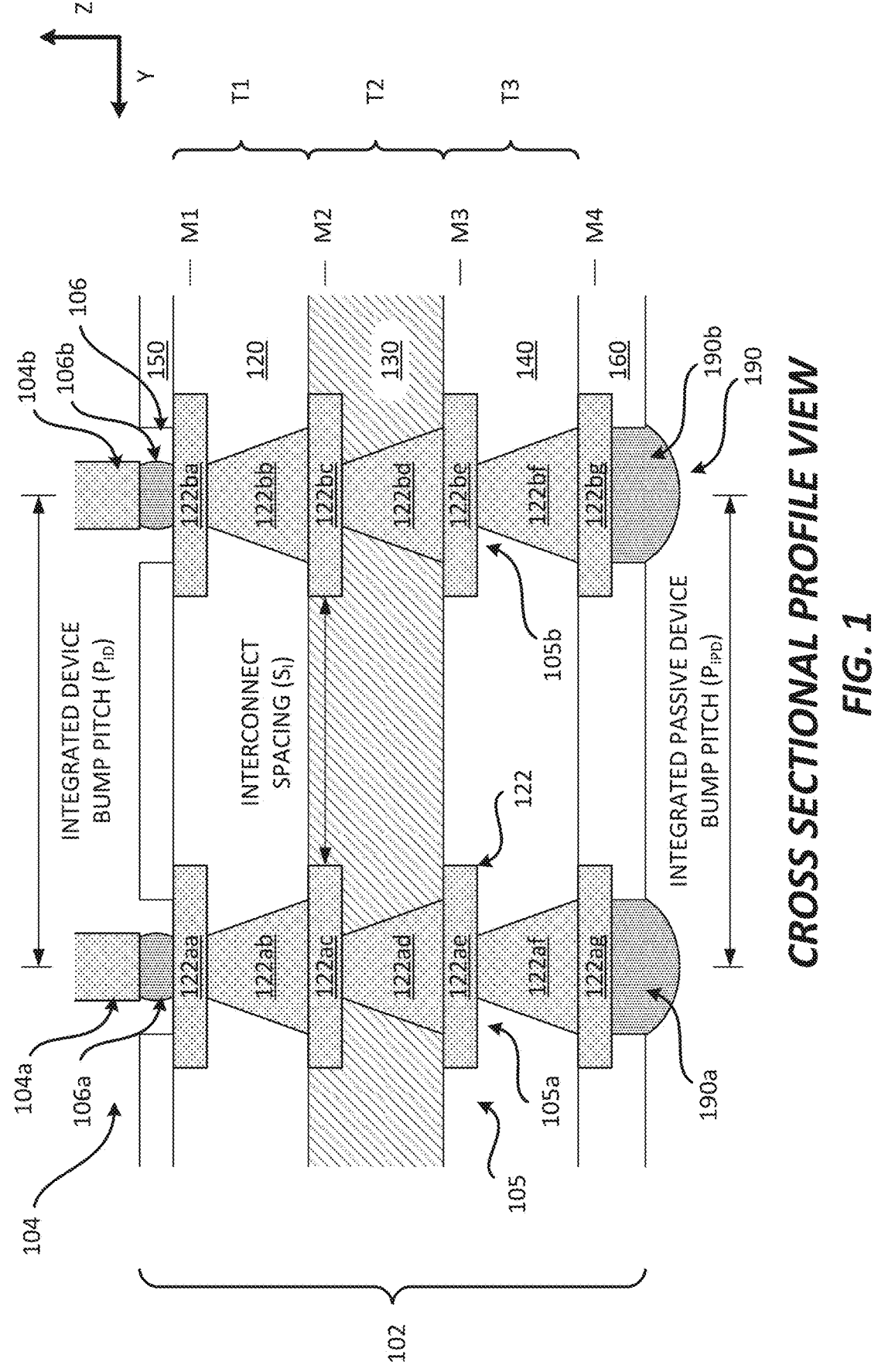
FIG. 1 illustrates a profile cross sectional view of a substrate.

Exemplary Package Comprising an Integrated Device and a Substrate Comprising Dielectric Layers with Different Materials FIG. 1 illustrates a profile cross sectional view of a substrate 102. The substrate 102 may be an embedded trace substrate (ETS). The substrate 102 may be a coreless substrate that is free of a core layer. The substrate 102 includes a dielectric layer 120, a dielectric layer 130, a dielectric layer 140, a plurality of interconnects 122, a solder resist layer 150 and a solder resist layer 160.

The dielectric layer 120 may be a first dielectric layer. The dielectric layer 130 may be a second dielectric layer. The dielectric layer 140 may be a third dielectric layer. The dielectric layer 120 is coupled to a first surface of the dielectric layer 130. The dielectric layer 140 is coupled to a second surface of the dielectric layer 130. The dielectric layer 130 may be located between the dielectric layer 120 and the dielectric layer 140. The dielectric layer 130 may include a different material than one or more materials from the dielectric layer 120 and the dielectric layer 140. In some implementations, the dielectric layer 130 (e.g., second dielectric layer) is free of a glass material. In some implementations, the dielectric layer 120 (e.g., first dielectric layer) and/or the dielectric layer 140 (e.g., third dielectric layer) includes a glass material. In some implementations, the dielectric layer 120 and/or the dielectric layer 140 include prepreg. The solder resist layer 150 may be located over (e.g., above) a surface of the dielectric layer 120. The solder resist layer 160 may be located over (e.g., below) a surface of the dielectric layer 140.

The plurality of interconnects 122 may be located at least in the dielectric layer 120, the dielectric layer 130 and the dielectric layer 140. Some interconnects from the plurality of interconnects 122 may be located in and/or over a surface of the dielectric layer 120, the dielectric layer 130 and the dielectric layer 140. The plurality of interconnects 122 include an interconnect 122*aa*, an interconnect 122*ab*, an interconnect 122*ac*, an interconnect 122*ad*, an interconnect 122*ae*, an interconnect 122*af*, an interconnect 122*ag*, an interconnect 122*ba*, an interconnect 122*bb*, an interconnect 122*bc*, an interconnect 122*bd*, an interconnect 122*be*, an interconnect 122*bf*, and an interconnect 122*bg*. The interconnect 122*aa*, the interconnect 122*ab*, the interconnect 122*ac*, the interconnect 122*ad*, the interconnect 122*ae*, the interconnect 122*af*, and/or the interconnect 122*ag* may define a first column of interconnects 105*a*. The interconnect 122*aa* is coupled to the interconnect 122*ab*. The interconnect 122*ab* is coupled to the interconnect 122*ac*. The interconnect 122*ac* is coupled to the interconnect 122*ad*. The interconnect 122*ad* is coupled to the interconnect 122*ae*. The interconnect 122*ae* is coupled to the interconnect 122*af*. The interconnect 122*af* is coupled to the interconnect 122*ag*. The interconnect 122*ba*, the interconnect 122*bb*, the interconnect 122*bc*, the interconnect 122*bd*, the interconnect 122*be*, the interconnect 122*bf*, and/or the interconnect 122*bg* may define a second column of interconnects 105*b*. The interconnect 122*ba* is coupled to the interconnect 122*bb*. The interconnect 122*bb* is coupled to the interconnect 122*bc*. The interconnect 122*bc* is coupled to the interconnect 122*bd*. The interconnect 122*bd* is coupled to the interconnect 122*be*. The interconnect 122*be* is coupled to the interconnect 122*bf*. The interconnect 122*bf* is coupled to the interconnect 122*bg*. The first column of interconnects 105*a* and the second column of interconnects 105*b* may be part of a plurality column of interconnects 105.

An integrated device (not shown) may be coupled to the substrate 102 through a plurality of pillar interconnects 104 and a plurality of solder interconnects 106. The plurality of pillar interconnects 104 include a pillar interconnect 104*a* and a pillar interconnect 104*b*. The plurality of solder interconnects 106 include a solder interconnect 106*a* and a solder interconnect 106*b*.

The pillar interconnect 104*a* is coupled to the first column of interconnects 105*a* through the solder interconnect 106*a*. The pillar interconnect 104*b* is coupled to the second column of interconnects 105*b* through the solder interconnect 106*b*. A plurality of solder interconnects 190 are coupled to the substrate 102. The plurality of solder interconnects 190 are coupled to the plurality of interconnects 122. For example, the plurality of solder interconnects 190 are coupled to the first column of interconnects 105*a* and the second column of interconnects 105*b*. In one example, a solder interconnect 190*a* is coupled to the first column of interconnects 105*a*, and a second solder interconnect 190*b* is coupled to the second column of interconnects 105*b*.

As shown in FIG. 1, the plurality of pillar interconnects 104 include adjacent pillar interconnects (e.g., 104*a*. 104*b*) that may have an integrated device bump pitch of $P_{ID}$. Similarly, the plurality of solder interconnects 106 include adjacent solder interconnects (e.g., 106*a*, 106*b*) that may have an integrated device bump solder pitch of $P_{IDS}$. Moreover, the plurality of solder interconnects 190 include adjacent solder interconnects (e.g., 190*a*, 190*b*) that may have an integrated passive device bump solder pitch of $P_{IDS}$. In some implementations, the pitch between adjacent columns of interconnects (e.g., 105*a*, 105*b*) may be $P_{CI}$. In some implementations, the pitch between adjacent columns of interconnects (e.g., 105*a*, 105*b*) is about the same as the pitch between adjacent solder interconnects (e.g., 106*a*, 106*b*) coupled to the adjacent columns of interconnects (e.g., 105*a*. 105*b*). In some implementations, the pitch between adjacent columns of interconnects (e.g., 105*a*, 105*b*) is about the same as the pitch between adjacent pillar interconnects (e.g., 104*a*. 104*b*) coupled to the adjacent columns of interconnects (e.g., 105*a*, 105*b*) through the adjacent solder interconnects (e.g., 106*a*, 106*b*). In some implementations, the pitch between adjacent columns of interconnects (e.g., 105*a*, 105*b*) is about the same as the pitch between adjacent solder interconnects (e.g., 190*a*. 190*b*) coupled to the adjacent columns of interconnects (e.g., 105*a*. 105*b*).

In some implementations, a pair of pad interconnects on a particular metal layer (e.g., M1, M2, M3, M4) from the first column of interconnects 105*a* and the second column of interconnects 105*b* may have a pitch that is about the same as another pair of pad interconnects on another metal layer (e.g., M1, M2, M3, M4) from the first column of interconnects 105*a* and the second column of interconnects 105*b*. For example, in some implementations, the pitch between the interconnect 122*aa* and the interconnect 122*ba* is about the same as the pitch between the interconnect 122*ac* and the interconnect 122*bc*. In some implementations, the pitch between the interconnect 122*aa* and the interconnect 122*ba* is about the same as the pitch between the interconnect 122*ae* and the interconnect 122*be*. In some implementations, the pitch between the interconnect 122*aa* and the interconnect 122*ba* is about the same as the pitch between the interconnect 122*ag* and the interconnect 122*bg*.

In some implementations, a pair of via interconnects between two particular metal layers from the first column of interconnects 105*a* and the second column of interconnects 105*b* may have a pitch that is about the same as another pair of via interconnects between two other metal layers from the first column of interconnects 105*a* and the second column of interconnects 105*b*. For example, in some implementations, the pitch between the interconnect 122*ab* and the interconnect 122*bb* is about the same as the pitch between the interconnect 122*ad* and the interconnect 122*bd*. In some implementations, the pitch between the interconnect 122*ab* and the interconnect 122*bb* is about the same as the pitch between the interconnect 122*af* and the interconnect 122*bf*.

In some implementations, a pair of pad interconnects on a particular metal layer from the first column of interconnects 105*a* and the second column of interconnects 105*b* may have a pitch that is about the same as a pair of via interconnects between two metal layers from the first column of interconnects 105*a* and the second column of interconnects 105*b*. For example, in some implementations, the pitch between the interconnect 122*aa* and the interconnect 122*ba* is about the same as the pitch between the interconnect 122*ab* and the interconnect 122*bb*. In some implementations, the pitch between the interconnect 122*ac* and the interconnect 122*bc* is about the same as the pitch between the interconnect 122ad and the interconnect 122bd. In some implementations, the pitch between the interconnect 122ae and the interconnect 122be is about the same as the pitch between the interconnect 122af and the interconnect 122bf.

The use of dielectric layers with different materials for different layers helps provide interconnects with smaller spacing and/or smaller pitch, allowing for higher density interconnects, shorter electrical paths for currents and/or signals, which can lead to improved performances for the integrated device and the package. Moreover, the use of a different dielectric material between two other dielectric layers will not significantly affect the overall warpage of the substrate, thus providing a substrate with reliable interconnects.

In some implementations, the pad interconnects (e.g., 122aa, 122ac, 122ae, 122ag, 122ba, 122bc, 122be, 122bg) from the first column of interconnects 105a and/or the second column of interconnects 105b may each have a minimum width and/or minimum diameter of about 90 micrometers. In some implementations, the first dielectric layer 120 may have a minimum thickness (T1) of about 20 micrometers. In some implementations, the second dielectric layer 130 may have a minimum thickness (T2) of about 15 micrometers. In some implementations, the third dielectric layer 140 may have a minimum thickness (T3) of about 20 micrometers. Thus, in some implementations, the thickness (T2) of the second dielectric layer 130 may be thinner than the thickness (T1) of the first dielectric layer 120 and/or the thickness (T3) of the third dielectric layer 140.

In some implementations, the via interconnects (e.g., 122ab, 122af, 122bb, 122bf) from the first column of interconnects 105a and/or the second column of interconnects 105b located in the first dielectric layer 120 and/or the third dielectric layer 140 may each have at its widest part, a minimum width and/or minimum diameter of about 60 micrometers. In some implementations, the via interconnects (e.g., 122ad, 122bd) from the first column of interconnects 105a and/or the second column of interconnects 105b located in the second dielectric layer 130 dielectric layer 140 may each have at its widest part, a minimum width and/or minimum diameter of about 50 micrometers. In some implementations, the above configuration of using a different dielectric layer between two dielectric layers, helps provide pairs of interconnects on the same metal layer from adjacent columns of interconnects to have similar or the same spacing (Si).

In some implementations, the first column of interconnects 105a is configured to provide an electrical path for power between an integrated device and a passive device. In some implementations, the second column of interconnects 105b is configured to provide an electrical path for ground between the integrated device and the passive device. A passive device may include a capacitor (e.g., discrete inductor). A passive device may include a decoupling capacitor configured to be coupled to power and/or a power distribution network.

It is noted that FIG. 1 illustrates a substrate that includes 4 metal layers. However, other implementations may include a substrate with more than 4 metal layers. Moreover, other substrates may include other dielectric layers similar to the second dielectric layer 130. For example, in some implementations, a substrate may include 5 metal layers with a first dielectric layer, a second dielectric layer, a third dielectric layer and a fourth dielectric layer, where the second dielectric layer and third dielectric layer are similar to the second dielectric layer 130, and where the first dielectric layer and the fourth dielectric layer are similar to the first dielectric layer 120.

Figure 2:
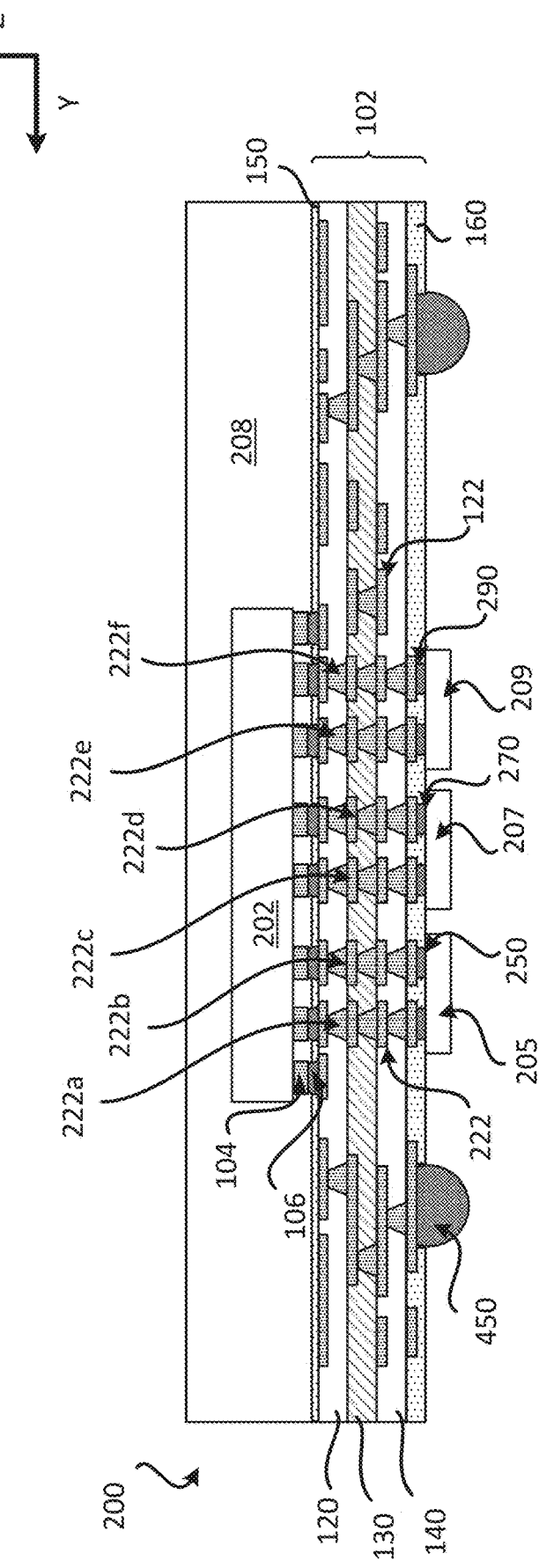
FIG. 2 illustrates a profile cross sectional view of a package that includes a substrate, an integrated device and a passive device.

FIG. 2 illustrates a package 200 that includes the substrate 102, an integrated device 202, a passive device 205, a passive device 207 and a passive device 209. The integrated device 202 is coupled to a first surface (e.g., top surface) of the substrate 102 through the plurality of pillar interconnects 104 and the plurality of solder interconnects 106. The passive device 205 is coupled to a second surface (e.g., bottom surface) of the substrate 102 through the plurality of solder interconnects 250. The passive device 207 is coupled to a second surface (e.g., bottom surface) of the substrate 102 through the plurality of solder interconnects 270. The passive device 209 is coupled to a second surface (e.g., bottom surface) of the substrate 102 through the plurality of solder interconnects 290. In some implementations, at least part of the passive device 205, at least part of the passive device 207 and/or at least part of the passive device 209 may vertically overlap with the integrated device 202.

The substrate 102 include a plurality of columns of interconnects 222. The plurality of columns of interconnects 222 is part of the plurality of interconnects 122 of the substrate 102. The plurality of columns of interconnects 222 may be configured and/or arranged in a similar manner as the first column of interconnects 105a and/or the second column of interconnects 105b.

The integrated device 202 is configured to be electrically coupled to the passive device 205 through an electrical path (e.g., for power) that includes a pillar interconnect from the plurality of pillar interconnects 104, a solder interconnect from the plurality of solder interconnects 106, a column of interconnect 222a and a solder interconnect from the plurality of solder interconnects 250. The integrated device 202 is configured to be electrically coupled to the passive device 205 through an electrical path (e.g., for ground) that includes a pillar interconnect from the plurality of pillar interconnects 104, a solder interconnect from the plurality of solder interconnects 106, a column of interconnect 222b and a solder interconnect from the plurality of solder interconnects 250.

The integrated device 202 is configured to be electrically coupled to the passive device 207 through an electrical path (e.g., for power) that includes a pillar interconnect from the plurality of pillar interconnects 104, a solder interconnect from the plurality of solder interconnects 106, a column of interconnect 222c and a solder interconnect from the plurality of solder interconnects 270. The integrated device 202 is configured to be electrically coupled to the passive device 207 through an electrical path (e.g., for ground) that includes a pillar interconnect from the plurality of pillar interconnects 104, a solder interconnect from the plurality of solder interconnects 106, at least a column of interconnect 222d and a solder interconnect from the plurality of solder interconnects 270.

The integrated device 202 is configured to be electrically coupled to the passive device 209 through an electrical path (e.g., for power) that includes a pillar interconnect from the plurality of pillar interconnects 104, a solder interconnect from the plurality of solder interconnects 106, a column of interconnect 222e and a solder interconnect from the plurality of solder interconnects 290. The integrated device 202 is configured to be electrically coupled to the passive device 207 through an electrical path (e.g., for ground) that includes a pillar interconnect from the plurality of pillar interconnects 104, a solder interconnect from the plurality of solder interconnects 106, a column of interconnect 222f and a solder interconnect from the plurality of solder interconnects 290. In some implementations, the integrated device 202, the passive device 205, the passive device 207 and the passive device 209 are configured to be electrically coupled to a power distribution network.

Figure 3:
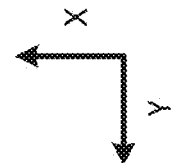
FIG. 3 illustrates a plan view of a substrate.

FIG. 3 illustrates a plan view of the substrate 102. As shown in FIG. 3, the substrate 102 includes the first dielectric layer 120, a plurality of interconnects 302 and a plurality of interconnects 304. The plurality of interconnects 302 and the plurality of interconnects 304 are located in a region 300 of the substrate 102 that vertically overlaps with an integrated device (e.g., 202). The plurality of interconnects 302 and the plurality of interconnects 304 may be located on a first metal layer (e.g., M1) of the substrate 102 The pitch and/or spacing of the plurality of interconnects 302 is greater than the pitch and/or spacing of the plurality of interconnects 304. The plurality of interconnects 302 may include interconnects that are part of the plurality of columns of interconnects (e.g., 105, 222) as described in at least FIGS. 1 and 2. The plurality of interconnects and/or the plurality of interconnects 304 may be part of the plurality of interconnects 122.

Figure 4:
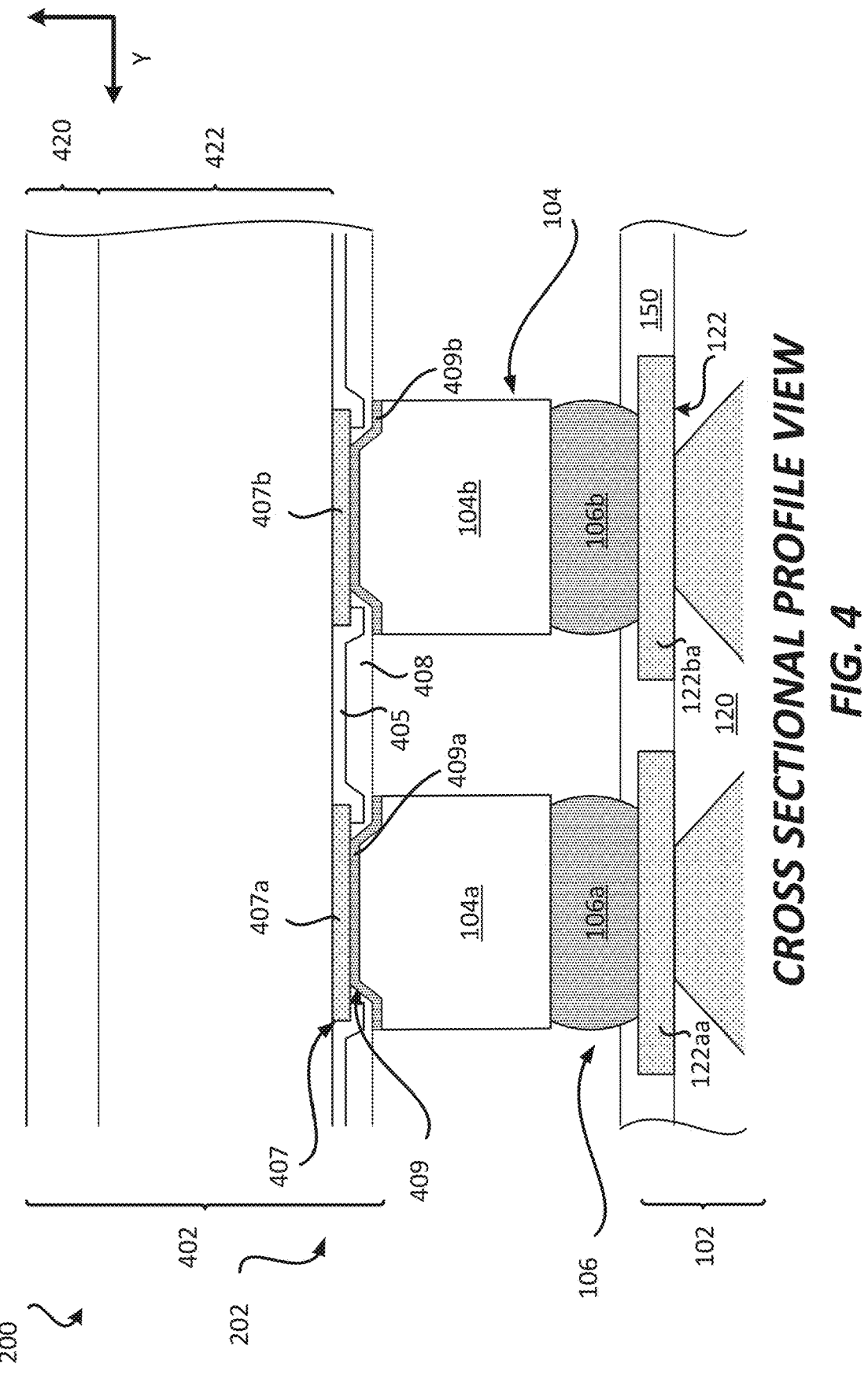
FIG. 4 illustrates a profile cross sectional view of a close up of an integrated device coupled to a substrate.

FIG. 4 illustrates a close up view of how an integrated device may be coupled to a substrate. The integrated device 202 may be coupled to the substrate 102 through a plurality of pillar interconnects and a plurality of solder interconnects. The integrated device 202 and the substrate 102 may be part of the package 200. The integrated device 202 includes a die portion 402, a plurality of pillar interconnects 104 and a plurality of solder interconnects 106. The plurality of pillar interconnects 104 are coupled to the die portion 402. The plurality of solder interconnects 106 are coupled to the plurality of pillar interconnects 104. The integrated device 202 may include a flip chip.

The die portion 402 includes a die substrate 420, an interconnect portion 422, a passivation layer 405, a passivation layer 408, a plurality of pads 407, a passivation layer 408 and a plurality of under bump metallization interconnects 409. The die substrate 420 may include silicon (Si). A plurality of cells (e.g., logic cells) and/or a plurality of transistors (not shown) may be formed in and/or over the die substrate 420. Different implementations may use different types of transistors, such as a field effect transistor (FET), planar FET, finFET, and a gate all around FET. In some implementations, a front end of line (FEOL) process may be used to fabricate the plurality of cells (e.g., logic cells) and/or transistors in and/or over the die substrate 420. The interconnect portion 422 is located over and coupled to the die substrate 420. The interconnect portion 422 may be coupled to the plurality of cells and/or transistors located in and/or over the die substrate 420. The interconnect portion 422 (e.g., die interconnect portion) may include a plurality of die interconnects (not shown) that are coupled to the plurality of cells and/or transistors. In some implementations, a back end of line (BEOL) process may be used to fabricate the interconnect portion 422.

The passivation layer 405 is located over and coupled to the interconnect portion 422. The passivation layer 405 may be a hard passivation layer. The passivation layer 408 is located over the passivation layer 405. The passivation layer 408 may include a polymer passivation layer. The plurality of pads 407 are located over the interconnect portion 422. The plurality of pads 407 may be coupled to die interconnects of the interconnect portion 422. In some implementations, the passivation layer 405, the passivation layer 408 and/or the plurality of pads 407 may be considered part of the interconnect portion 422. In some implementations, a back end of line (BEOL) process may be used to fabricate the passivation layer 405, the passivation layer 408 and the plurality of pads 407. The plurality of under bump metallization interconnects 409 are coupled to the plurality of pads 407. The plurality of under bump metallization interconnects 409 may be located over the plurality of pads 407. In some implementations, there may be additional interconnects between the plurality of pads 407 and the plurality of under bump metallization interconnects 409. For example, there may be metallization interconnects between the plurality of pads 407 and the plurality of under bump metallization interconnects 409. Examples of metallization interconnects include redistribution interconnects. In some implementations, the plurality of under bump metallization interconnects 409 may be coupled to the plurality of pads 407 through metallization interconnects (e.g., redistribution interconnects).

The plurality of pillar interconnects 104 may be coupled to the die portion 402. The plurality of pillar interconnects 104 may be coupled to the plurality of under bump metallization interconnects 409. The plurality of pillar interconnects 104 may be coupled to the die portion 402 through the plurality of under bump metallization interconnects 409. The plurality of pillar interconnects 104 may be a means for pillar interconnection. The plurality of under bump metallization interconnects 409 may be a means for under bump metallization interconnection.

The plurality of pads 407 include a first pad 407a and a second pad 407b. The plurality of under bump metallization interconnects 409 include a first under bump metallization interconnect 409a and a second under bump metallization interconnect 409b. The plurality of pillar interconnects 104 include a first pillar interconnect 104a and a second pillar interconnect 104b. The plurality of solder interconnect 106 include a first solder interconnect 106a and a second solder interconnect 106b.

The first under bump metallization interconnect 409a is coupled to the first pad 407a. The first pillar interconnect 104a is coupled to the first under bump metallization interconnect 409a. The first solder interconnect 106a is coupled to the first pillar interconnect 104a. It is noted that in some implementations, the first pillar interconnect 104a is coupled to the first under bump metallization interconnect 409a through at least one metallization interconnect. That is, at least one metallization interconnect (e.g., redistribution interconnect) may be located between the first pillar interconnect 104a and the first under bump metallization interconnect 409a.

The second under bump metallization interconnect 409b is coupled to the second pad 407b. The second pillar interconnect 104b is coupled to the second under bump metallization interconnect 409b. The second solder interconnect 106b is coupled to the second pillar interconnect 104b. It is noted that in some implementations, the second pillar interconnect 104b is coupled to the second under bump metallization interconnect 409b through at least one metallization interconnect. That is, at least one metallization interconnect (e.g., redistribution interconnect) may be located between the second pillar interconnect 104b and the second under bump metallization interconnect 409b.

The integrated device 202 is coupled to the substrate 102 through the plurality of solder interconnects 106 and the plurality of pillar interconnects 104. For example, the solder interconnect 106a may be directly coupled to the interconnect 122aa and the pillar interconnect 104a. In some implementations, the solder interconnect 106b may be directly coupled to the interconnect 122ba and the pillar interconnect 104b.

An integrated device (e.g., 202) may include a die (e.g., semiconductor bare die). The integrated device may include a power management integrated circuit (PMIC). The integrated device may include an application processor. The integrated device may include a modem. The integrated device may include a radio frequency (RF) device, a passive device, a filter, a capacitor, an inductor, an antenna, a transmitter, a receiver, a gallium arsenide (GaAs) based integrated device, a surface acoustic wave (SAW) filter, a bulk acoustic wave (BAW) filter, a light emitting diode (LED) integrated device, a silicon (Si) based integrated device, a silicon carbide (SiC) based integrated device, a memory, power management processor, and/or combinations thereof. An integrated device (e.g., 02) may include at least one electronic circuit (e.g., first electronic circuit, second electronic circuit, etc. . . . ). An integrated device may include transistors. An integrated device may be an example of an electrically component and/or electrical device. In some implementations, an integrated device may be a chiplet. A chiplet may be fabricated using a process that provides better yields compared to other processes used to fabricate other types of integrated devices, which can lower the overall cost of fabricating a chiplet. Different chiplets may have different sizes and/or shapes. Different chiplets may be configured to provide different functions. Different chiplets may have different interconnect densities (e.g., interconnects with different width and/or spacing). In some implementations, several chiplets may be used to perform the functionalities of one or more chips (e.g., one more integrated devices). Thus, for example, a single integrated device may be split into several chiplets. As mentioned above, using several chiplets that perform several functions may reduce the overall cost of a package relative to using a single chip to perform all of the functions of a package. In some implementations, one or more of the chiplets and/or one of more of integrated devices (e.g., 202) described in the disclosure may be fabricated using the same technology node or two or more different technology nodes. For example, an integrated device (e.g., 202) may be fabricated using a first technology node, and a chiplet may be fabricated using a second technology node that is not as advanced as the first technology node. In such an example, the integrated device (e.g., 202) may include components (e.g., interconnects, transistors) that have a first minimum size, and the chiplet may include components (e.g., interconnects, transistors) that have a second minimum size, where the second minimum size is greater than the first minimum size. In some implementations, an integrated device and another integrated device of a package, may be fabricated using the same technology node or different technology nodes. In some implementations, a chiplet and another chiplet of a package, may be fabricated using the same technology node or different technology nodes.

Exemplary Sequence for Fabricating a Substrate

In some implementations, fabricating a substrate includes several processes. FIGS. 5A-5D illustrate an exemplary sequence for providing or fabricating a substrate. In some implementations, the sequence of FIGS. 5A-5D may be used to provide or fabricate the substrate 102. However, the process of FIGS. 5A-5D may be used to fabricate any of the substrates described in the disclosure.

It should be noted that the sequence of FIGS. 5A-5D may combine one or more stages in order to simplify and/or clarify the sequence for providing or fabricating a substrate.

In some implementations, the order of the processes may be changed or modified. In some implementations, one or more of processes may be replaced or substituted without departing from the scope of the disclosure.

Figure 5A:
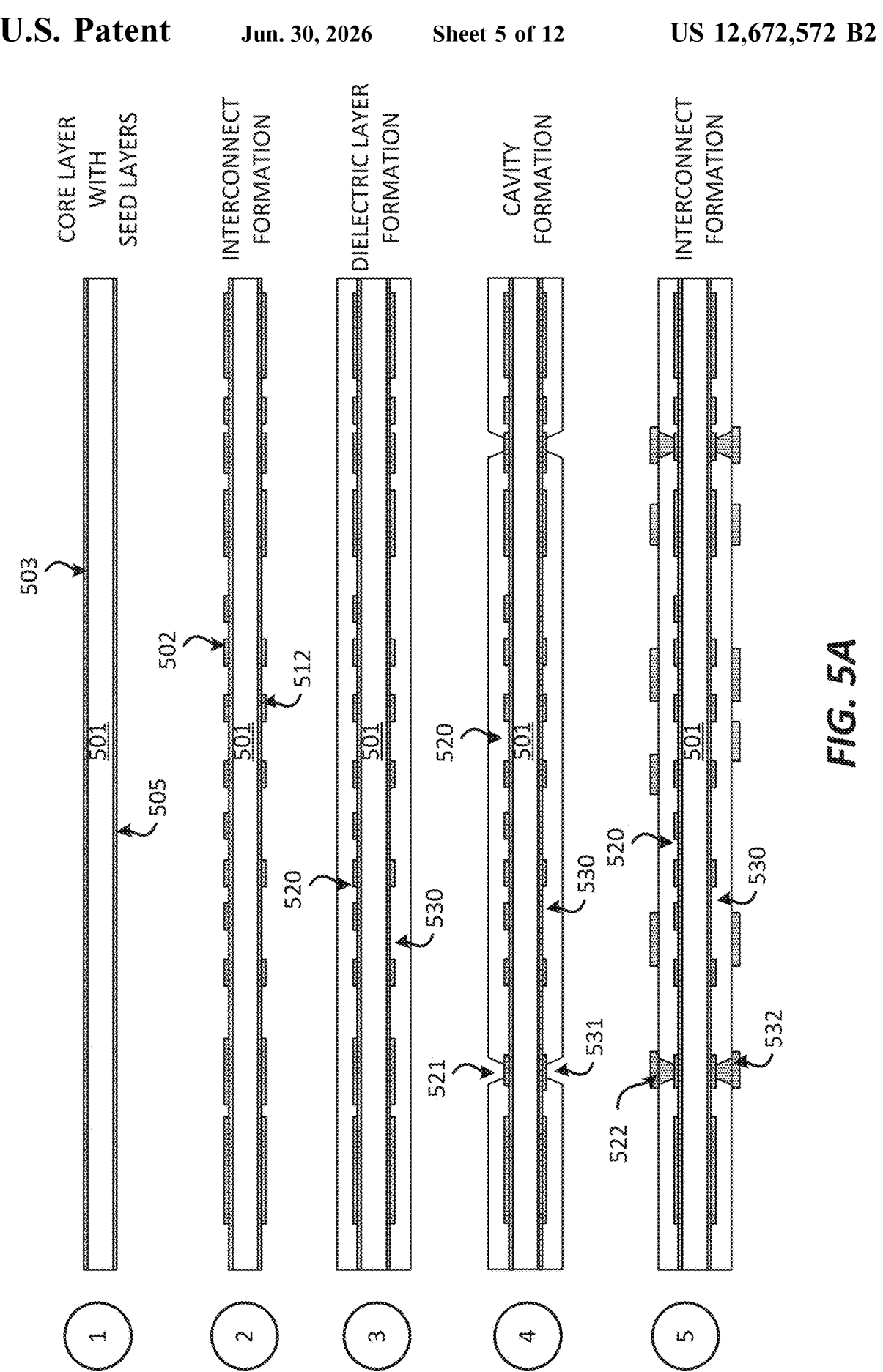
FIGS. 5A-5D illustrate an exemplary sequence for fabricating a substrate with different dielectric layers.

Stage 1, as shown in FIG. 5A, illustrates a state after a core layer 501 is provided. The core layer 501 may include a seed layer 503 located on a first surface of the core layer 501 and a seed layer 505 located on a second surface of the core layer 501. The core layer 501 may be a dielectric. The core layer 501 may be a carrier.

Stage 2 illustrates a state after interconnects are formed in and over surfaces of the core layer 501, the seed layer 503 and/or the seed layer 505. A plurality of interconnects 502 may be formed over (e.g., above) a first surface of the core layer 501 and/or the seed layer 503. The seed layer 503 may be part of the plurality of interconnects 502. A plurality of interconnects 512 may be formed over (e.g., below) a second surface of the core layer 501 and/or the seed layer 505. The seed layer 505 may be part of the plurality of interconnects 512. A masking, a plating and/or an etching process may be used to form the plurality of interconnects 502 and/or the plurality of interconnects 512.

Stage 3 illustrates a state after a dielectric layer 520 is formed over (e.g., above) the first surface of the core layer 501, the seed layer 503, and/or the plurality of interconnects 502. Stage 4 also illustrates a state after a dielectric layer 530 is formed over (e.g., below) the second surface of the core layer 501, the seed layer 505, and/or the plurality of interconnects 512. A deposition and/or a lamination process may be used to form the dielectric layer 520 and the dielectric layer 530. The dielectric layer 520 and the dielectric layer 530 may be different than the core layer 501.

Stage 4 illustrates a state after a plurality of cavities 521 are formed in the dielectric layer 520 and a plurality of cavities 531 are formed in the dielectric layer 530. The plurality of cavities 521 and the plurality of cavities 531 may be formed using a photolithography process (e.g., exposure and development) and/or a laser process (e.g., laser ablation). A masking, an exposure and/or a development process may be used to form the plurality of cavities 521 and the plurality of cavities 531.

Stage 5 illustrates a state after interconnects are formed in and over surfaces of the dielectric layer 520 and the dielectric layer 530. A plurality of interconnects 522 may be formed over (e.g., above) a first surface of the dielectric layer 520 and the plurality of cavities 521. A plurality of interconnects 532 may be formed over (e.g., below) a second surface of the dielectric layer 530 and the plurality of cavities 531. A masking, a plating and/or an etching process may be used to form the plurality of interconnects 522 and/or the plurality of interconnects 532.

Figure 5B:
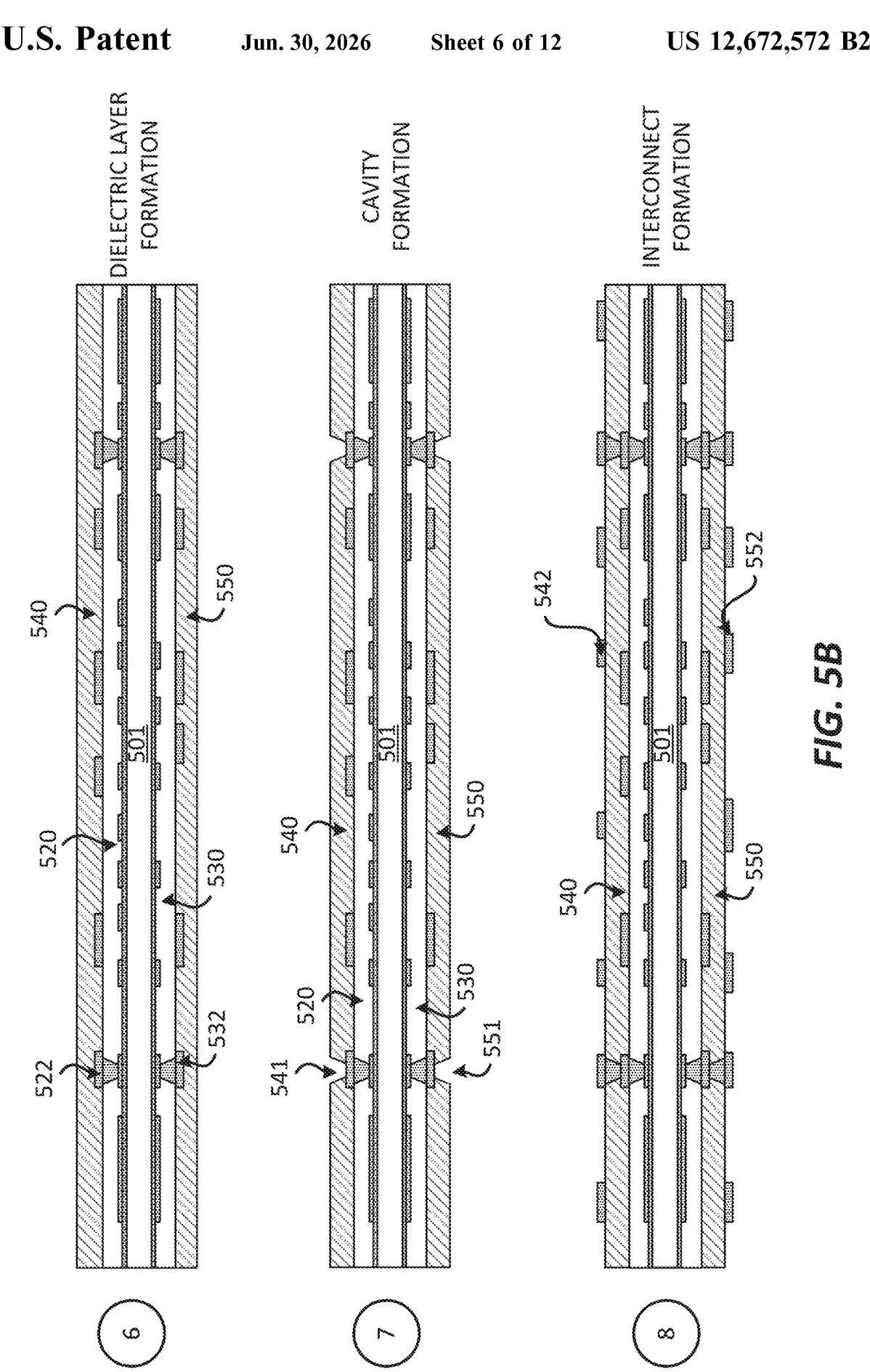

Stage 6, as shown in FIG. 5B, illustrates a state after a dielectric layer 540 is formed over (e.g., above) the first surface of the dielectric layer 520 and the plurality of interconnects 522. Stage 7 also illustrates a state after a dielectric layer 550 is formed over (e.g., below) the second surface of the dielectric layer 530 and the plurality of interconnects 532. A deposition and/or a lamination process may be used to form the dielectric layer 540 and the dielectric layer 550. The dielectric layer 540 and/or the dielectric layer 550 may be a different dielectric material than the dielectric material from the dielectric layer 520 and/or the dielectric layer 530.

Stage 7 illustrates a state after a plurality of cavities 541 are formed in the dielectric layer 540 and a plurality of cavities 551 are formed in the dielectric layer 550. The plurality of cavities 541 and the plurality of cavities 551 may be formed using a photolithography process (e.g., exposure and development) and/or laser process (e.g., laser ablation). A masking, an exposure and/or a development process may be used to form the plurality of cavities 541 and the plurality of cavities 551.

Stage 8 illustrates a state after interconnects are formed in and over surfaces of the dielectric layer 540 and the dielectric layer 550. A plurality of interconnects 542 may be formed over (e.g., above) a first surface of the dielectric layer 540 and the plurality of cavities 541. A plurality of interconnects 552 may be formed over (e.g., below) a second surface of the dielectric layer 550 and the plurality of cavities 551. A masking, a plating and/or an etching process may be used to form the plurality of interconnects 542 and/or the plurality of interconnects 552.

Figure 5C:
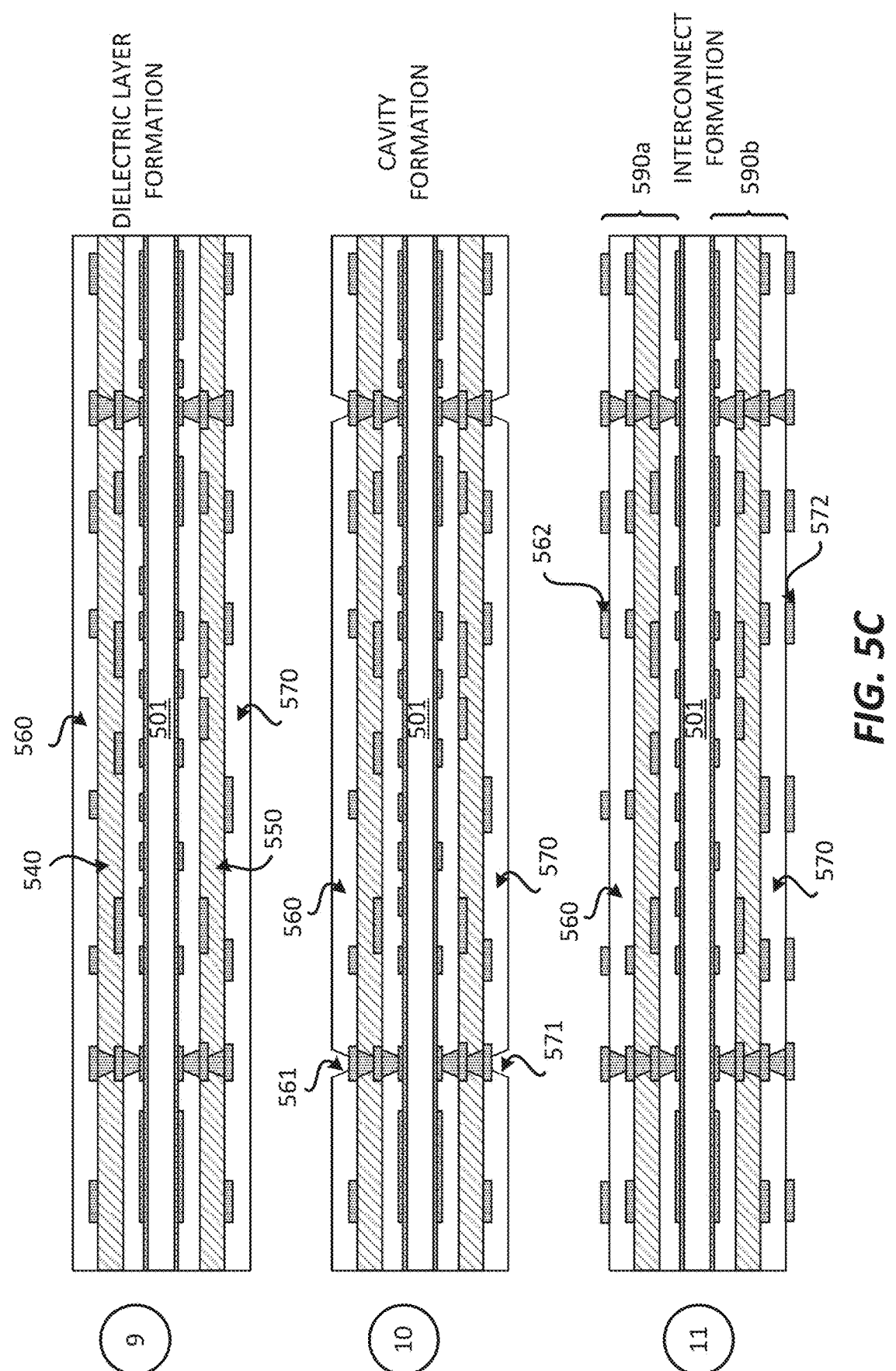

Stage 9, as shown in FIG. 5C, illustrates a state after a dielectric layer 560 is formed over (e.g., above) the first surface of the dielectric layer 540 and the plurality of interconnects 542. Stage 9 also illustrates a state after a dielectric layer 570 is formed over (e.g., below) the second surface of the dielectric layer 550 and the plurality of interconnects 552. A deposition and/or a lamination process may be used to form the dielectric layer 560 and the dielectric layer 570. The dielectric layer 560 and/or the dielectric layer 570 may be a different dielectric material than the dielectric layer 540 and/or the dielectric layer 550. The dielectric layer 560 and/or the dielectric layer 570 may be a similar dielectric material than the dielectric layer 520 and/or the dielectric layer 530.

Stage 10 illustrates a state after a plurality of cavities 561 are formed in the dielectric layer 560 and a plurality of cavities 571 are formed in the dielectric layer 570. The plurality of cavities 561 and the plurality of cavities 571 may be formed using a photolithography process (e.g., exposure and development) and/or a laser process (e.g., laser ablation). A masking, an exposure and/or a development process may be used to form the plurality of cavities 561 and the plurality of cavities 571.

Stage 11 illustrates a state after interconnects are formed in and over surfaces of the dielectric layer 560 and the dielectric layer 570. A plurality of interconnects 562 may be formed over (e.g., above) a first surface of the dielectric layer 560 and the plurality of cavities 561. A plurality of interconnects 572 may be formed over (e.g., below) a second surface of the dielectric layer 570 and the plurality of cavities 571. A masking, a plating and/or an etching process may be used to form the plurality of interconnects 562 and/or the plurality of interconnects 572. Stage 11 may illustrate a substrate 590a and a substrate 590b that are coupled to the core layer 501.

Figure 5D:
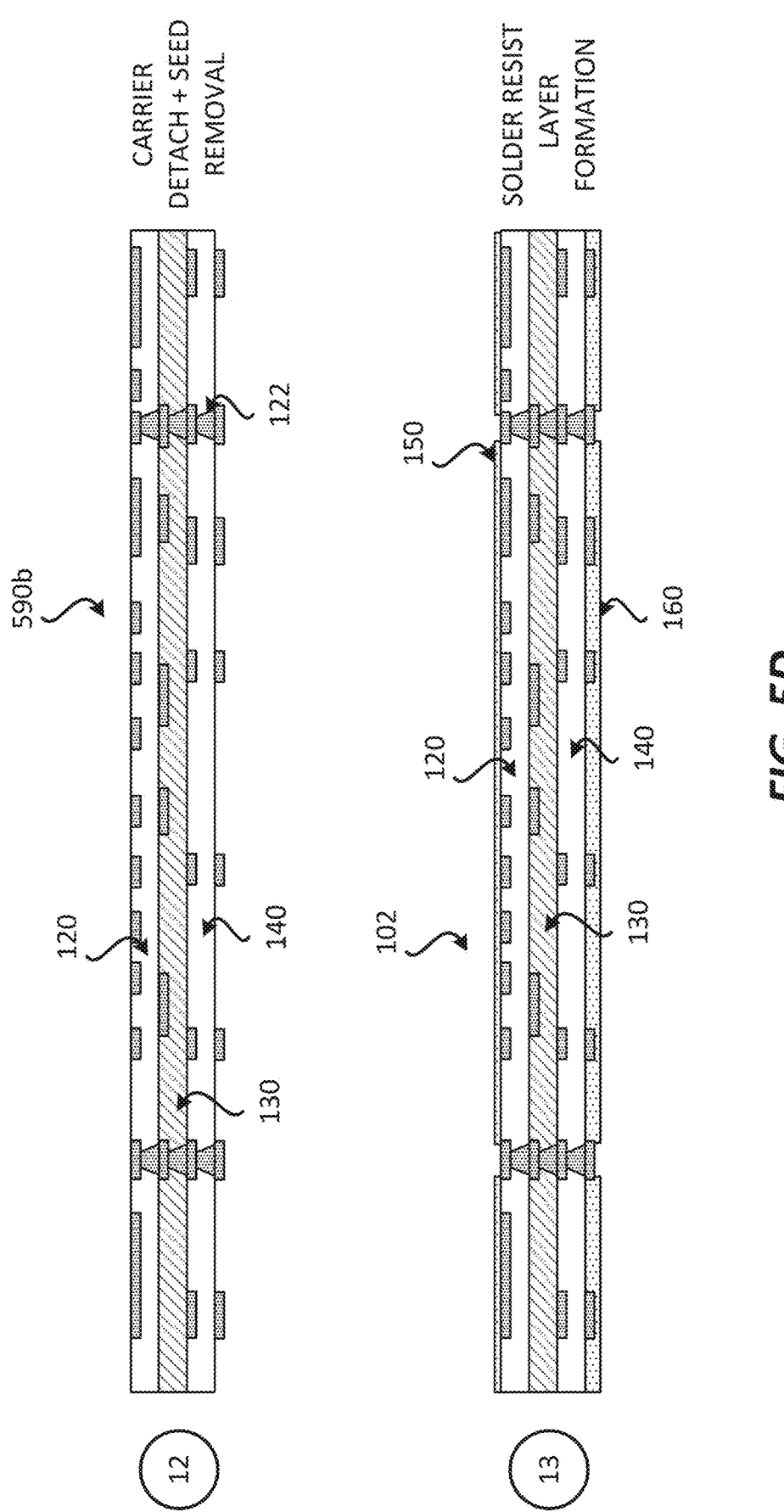

Stage 12, as shown in FIG. 5D, illustrates a state after the substrate 590b is detached from the core layer 501. A portion of the seed layer 505 may also be removed. The substrate 590a may also be detached from the core layer 501 in a similar manner. The substrate 590b may represent the substrate 102 that includes the dielectric layer 120, the dielectric layer 130 and the dielectric layer 140. For example, the first dielectric layer 120 may be the dielectric layer 530, the second dielectric layer 130 may be the dielectric layer 550, and the third dielectric layer 140 may be the dielectric layer 570. The plurality of interconnects 122 may represent the plurality of interconnects 532, the plurality of interconnects 552 and/or the plurality of interconnects 572.

In a similar manner, the substrate 590a may represent the substrate 102 that includes the dielectric layer 120, the dielectric layer 130 and the dielectric layer 140. For example, the first dielectric layer 120 may be the dielectric layer 520, the second dielectric layer 130 may be the dielectric layer 540, and the third dielectric layer 140 may be the dielectric layer 560. The plurality of interconnects 122 may represent the plurality of interconnects 522, the plurality of interconnects 542 and/or the plurality of interconnects 562.

Stage 13 illustrates a state after a solder resist layer 150 and a solder resist layer 160 are formed. A lamination process and/or a deposition process may be used to formed the solder resist layer 150 and the solder resist layer 160.

It is noted that additional dielectric layers and/or additional interconnects may be formed, by repeating some of the processes described above.

Different implementations may use different processes for forming the metal layer(s) and/or interconnects. In some implementations, a chemical vapor deposition (CVD) process, a physical vapor deposition (PVD) process, a sputtering process, a spray coating process, and/or a plating process may be used to form the metal layer(s).

Exemplary Flow Diagram of a Method FOR Fabricating a Substrate

In some implementations, fabricating a substrate includes several processes. FIG. 6 illustrates an exemplary flow diagram of a method 600 for providing or fabricating a substrate. In some implementations, the method 600 of FIG. 6 may be used to provide or fabricate the substrate 102 described in the disclosure. However, the method 600 may be used to provide or fabricate any of the substrates described in the disclosure.

It should be noted that the method of FIG. 6 may combine one or more processes in order to simplify and/or clarify the method for providing or fabricating a substrate. In some implementations, the order of the processes may be changed or modified. In some implementations, one or more of processes may be replaced or substituted without departing from the scope of the disclosure.

The method provides (at 605) a core layer and at least one seed layer. Stage 1, as shown in FIG. 5A, illustrates a state after a core layer 501 is provided. The core layer 501 may include a seed layer 503 located on a first surface of the core layer 501 and a seed layer 505 located on a second surface of the core layer 501. The core layer 501 may be a dielectric. The core layer 501 may be a carrier.

The method forms and patterns (at 610) a plurality of interconnects over (e.g., above, below) the core layer and/or the at least one seed layer. Stage 2 of FIG. 5A, illustrates a state after interconnects are formed in and over surfaces of the core layer 501, the seed layer 503 and/or the seed layer 505. A plurality of interconnects 502 may be formed over (e.g., above) a first surface of the core layer 501 and/or the seed layer 503. The seed layer 503 may be part of the plurality of interconnects 502. A plurality of interconnects 512 may be formed over (e.g., below) a second surface of the core layer 501 and/or the seed layer 505. The seed layer 505 may be part of the plurality of interconnects 512. A masking, a plating and/or an etching process may be used to form the plurality of interconnects 502 and/or the plurality of interconnects 512.

The method forms (at 615) at least one dielectric layer over (e.g., above, below) the plurality of interconnects, the core layer, and/or the seed layer. Stage 3 of FIG. 5A, illustrates a state after a dielectric layer 520 is formed over (e.g., above) the first surface of the core layer 501, the seed layer 503, and/or the plurality of interconnects 502. Stage 3 also illustrates a state after a dielectric layer 530 is formed over (e.g., below) the second surface of the core layer 501, the seed layer 505, and/or the plurality of interconnects 512.

A deposition and/or a lamination process may be used to form the dielectric layer 520 and the dielectric layer 530. The dielectric layer 520 and the dielectric layer 530 may be different than the core layer 501.

The method forms (at 620) a plurality of interconnects in and over the at least one dielectric layer (e.g., first dielectric layer). Forming a plurality of interconnects may include forming a plurality of cavities in the at least one dielectric layer (e.g., first dielectric layer) and performing a plating process. Stage 4 of FIG. 5A, illustrates a state after a plurality of cavities 521 are formed in the dielectric layer 520 and a plurality of cavities 531 are formed in the dielectric layer 530. The plurality of cavities 521 and the plurality of cavities 531 may be formed using a photolithography process (e.g., exposure and development) and/or a laser process (e.g., laser ablation). A masking, an exposure and/or a development process may be used to form the plurality of cavities 521 and the plurality of cavities 531. It is noted that in some implementations, forming cavities in a dielectric layer may be considered part of forming a dielectric layer.

Stage 5 of FIG. 5A, illustrates a state after interconnects are formed in and over surfaces of the dielectric layer 520 and the dielectric layer 530. A plurality of interconnects 522 may be formed over (e.g., above) a first surface of the dielectric layer 520 and the plurality of cavities 521. A plurality of interconnects 532 may be formed over (e.g., below) a second surface of the dielectric layer 530 and the plurality of cavities 531. A masking, a plating and/or an etching process may be used to form the plurality of interconnects 522 and/or the plurality of interconnects 532.

The method forms (at 625) at least one dielectric layer over (e.g., above, below) a dielectric layer (e.g., first dielectric layer). The dielectric layer may be a second dielectric layer that is formed over a first dielectric layer. The second dielectric layer may be a different material than the material of the first dielectric layer. Stage 6, as shown in FIG. 5B, illustrates a state after a dielectric layer 540 is formed over (e.g., above) the first surface of the dielectric layer 520 and the plurality of interconnects 522. Stage 7 also illustrates a state after a dielectric layer 550 is formed over (e.g., below) the second surface of the dielectric layer 530 and the plurality of interconnects 532. A deposition and/or a lamination process may be used to form the dielectric layer 540 and the dielectric layer 550. The dielectric layer 540 and/or the dielectric layer 550 may be a different dielectric material than the dielectric layer 520 and/or the dielectric layer 530.

The method forms (at 630) a plurality of interconnects in and over the at least one dielectric layer (e.g., second dielectric layer). Forming a plurality of interconnects may include forming a plurality of cavities in the at least one dielectric layer (e.g., second dielectric layer) and performing a plating process. Stage 7 of FIG. 5B, illustrates a state after a plurality of cavities 541 are formed in the dielectric layer 540 and a plurality of cavities 551 are formed in the dielectric layer 550. The plurality of cavities 541 and the plurality of cavities 551 may be formed using a photolithography process (e.g., exposure and development) and/or laser process (e.g., laser ablation). A masking, an exposure and/or a development process may be used to form the plurality of cavities 541 and the plurality of cavities 551. It is noted that in some implementations, forming cavities in a dielectric layer may be considered part of forming a dielectric layer.

Stage 8 of FIG. 5B, illustrates a state after interconnects are formed in and over surfaces of the dielectric layer 540 and the dielectric layer 550. A plurality of interconnects 542 may be formed over (e.g., above) a first surface of the dielectric layer 540 and the plurality of cavities 541. A plurality of interconnects 552 may be formed over (e.g., below) a second surface of the dielectric layer 550 and the plurality of cavities 551. A masking, a plating and/or an etching process may be used to form the plurality of interconnects 542 and/or the plurality of interconnects 552.

The method forms (at 630) at least one dielectric layer over (e.g., above, below) a dielectric layer (e.g., second dielectric layer). The dielectric layer may be a third dielectric layer that is formed over a second dielectric layer. The third dielectric layer may be a different material than the second dielectric layer. The third dielectric layer may be a same or similar material than the first dielectric layer. Stage 9, as shown in FIG. 5C, illustrates a state after a dielectric layer 560 is formed over (e.g., above) the first surface of the dielectric layer 540 and the plurality of interconnects 542. Stage 9 also illustrates a state after a dielectric layer 570 is formed over (e.g., below) the second surface of the dielectric layer 550 and the plurality of interconnects 552. A deposition and/or a lamination process may be used to form the dielectric layer 560 and the dielectric layer 570. The dielectric layer 560 and/or the dielectric layer 570 may be a different dielectric material than the dielectric layer 540 and/or the dielectric layer 550. The dielectric layer 560 and/or the dielectric layer 570 may be a similar dielectric material than the dielectric material of the dielectric layer 520 and/or the dielectric layer 530.

The method forms (at 640) a plurality of interconnects in and over the at least one dielectric layer (e.g., third dielectric layer). Forming a plurality of interconnects may include forming a plurality of cavities in the at least one dielectric layer (e.g., third dielectric layer) and performing a plating process. Stage 10 of FIG. 5C, illustrates a state after a plurality of cavities 561 are formed in the dielectric layer 560 and a plurality of cavities 571 are formed in the dielectric layer 570. The plurality of cavities 561 and the plurality of cavities 571 may be formed using a photolithography process (e.g., exposure and development) and/or a laser process (e.g., laser ablation). A masking, an exposure and/or a development process may be used to form the plurality of cavities 561 and the plurality of cavities 571. It is noted that in some implementations, forming cavities in a dielectric layer may be considered part of forming a dielectric layer.

Stage 11 of FIG. 5C, illustrates a state after interconnects are formed in and over surfaces of the dielectric layer 560 and the dielectric layer 570. A plurality of interconnects 562 may be formed over (e.g., above) a first surface of the dielectric layer 560 and the plurality of cavities 561. A plurality of interconnects 572 may be formed over (e.g., below) a second surface of the dielectric layer 570 and the plurality of cavities 571. A masking, a plating and/or an etching process may be used to form the plurality of interconnects 562 and/or the plurality of interconnects 572. Stage 11 may illustrate a substrate 590a and a substrate 590b that are coupled to the core layer 501.

The method decouples (at 645) the core layer from the dielectric layers. In some implementations, portions of the seed layer may also be removed. Stage 12 of FIG. 5D, illustrates a state after the substrate 590b is detached from the core layer 501. A portion of the seed layer 505 may also be removed. The substrate 590a may also be detached from the core layer 501 in a similar manner. The substrate 590b may represent the substrate 102 that includes the dielectric layer 120, the dielectric layer 130 and the dielectric layer 140. For example, the first dielectric layer 120 may be the dielectric layer 530, the second dielectric layer 130 may be the dielectric layer 550, and the third dielectric layer 140 may be the dielectric layer 570. The plurality of interconnects 122 may represent the plurality of interconnects 532, the plurality of interconnects 552 and/or the plurality of interconnects 572.

In a similar manner, the substrate 590a may represent the substrate 102 that includes the dielectric layer 120, the dielectric layer 130 and the dielectric layer 140. For example, the first dielectric layer 120 may be the dielectric layer 520, the second dielectric layer 130 may be the dielectric layer 540, and the third dielectric layer 140 may be the dielectric layer 560. The plurality of interconnects 122 may represent the plurality of interconnects 522, the plurality of interconnects 542 and/or the plurality of interconnects 562.

In some implementations, the method may also form one or more solder resist layers over one or more dielectric layers. Stage 13 of FIG. 5D, illustrates a state after a solder resist layer 150 and a solder resist layer 160 are formed. A lamination process and/or a deposition process may be used to formed the solder resist layer 150 and the solder resist layer 160. It is noted that the above method may be used to fabricate a substrate with more metal layers and more dielectric layers.

Different implementations may use different processes for forming the metal layer(s) and/or interconnects. In some implementations, a chemical vapor deposition (CVD) process, a physical vapor deposition (PVD) process, a sputtering process, a spray coating process, and/or a plating process may be used to form the metal layer(s).

Figure 7:
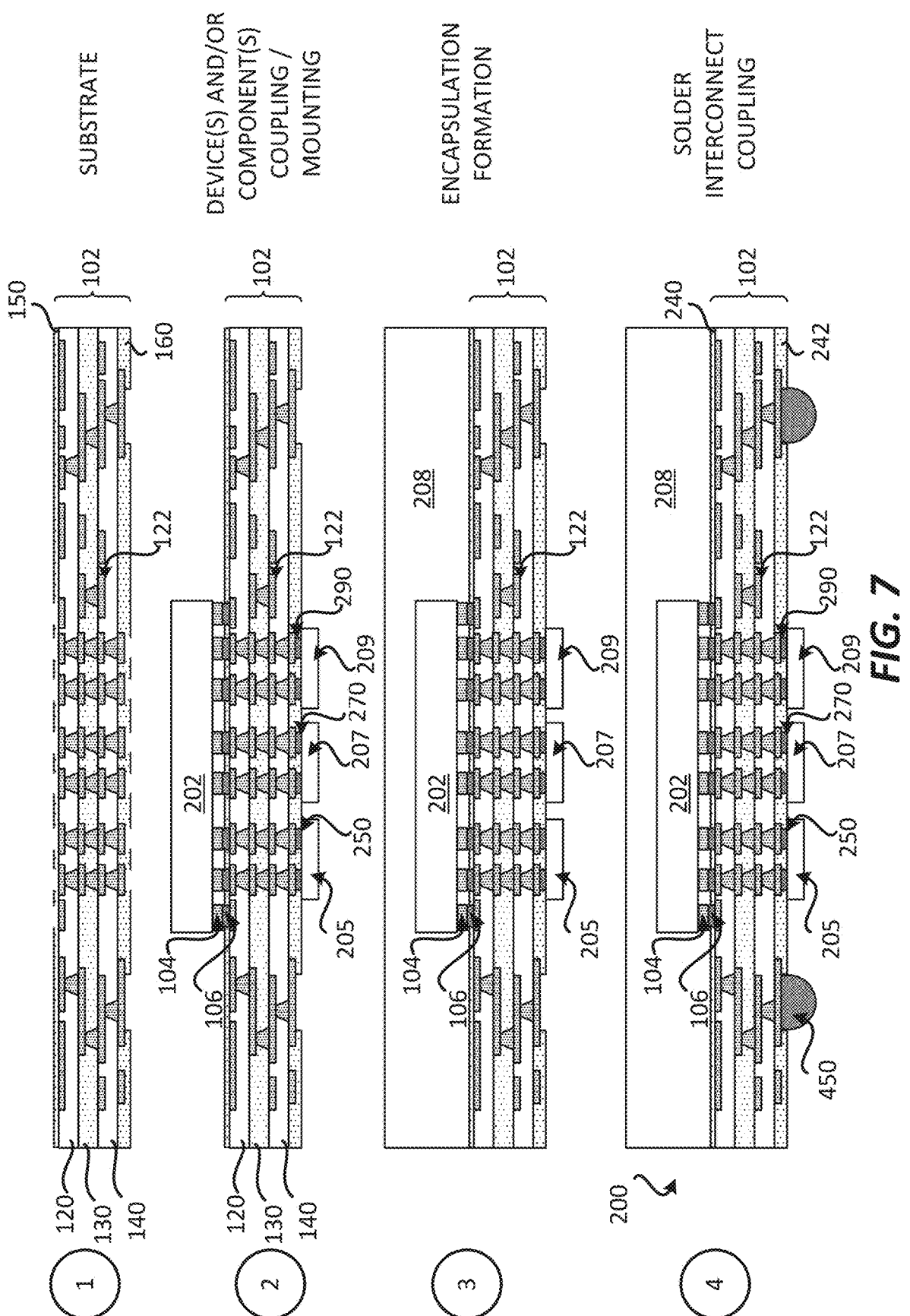
FIG. 7 illustrates an exemplary sequence for fabricating a package comprising a substrate, an integrated device and a passive device.

Exemplary Sequence for Fabricating a Package Comprising a Substrate, an Integrated Device and a Passive Device In some implementations, fabricating a package includes several processes. FIG. 7 illustrates an exemplary sequence for providing or fabricating a package that includes a substrate. In some implementations, the sequence of FIG. 7 may be used to provide or fabricate the package 200 of FIG. 2. However, the process of FIG. 7 may be used to fabricate any of the packages described in the disclosure.

It should be noted that the sequence of FIG. 7 may combine one or more stages in order to simplify and/or clarify the sequence for providing or fabricating a package. In some implementations, the order of the processes may be changed or modified. In some implementations, one or more of processes may be replaced or substituted without departing from the scope of the disclosure.

Stage 1, as shown in FIG. 7 illustrates a state after a substrate 102 is provided. The substrate 102 includes the first dielectric layer 120, the second dielectric layer 130, the third dielectric layer 140, the solder resist layer 150, the solder resist layer 160 and a plurality of interconnects 122. The second dielectric layer 130 may include a different dielectric material from the dielectric material of the first dielectric layer 120 and/or the third dielectric layer 140. The second dielectric layer 130 may be free of a glass material. In some implementations, the dielectric layer 130 may include Ajinomoto Build-Up Film (ABF). The first dielectric layer 120 and/or the third dielectric layer 140 may include a glass material. FIGS. 5A-5D illustrate an example of fabricating a substrate.

Stage 2 illustrates a state after the integrated device 202 is coupled to a first surface of the substrate 102 through the plurality of pillar interconnects 104 and a plurality of solder interconnects 106. A solder reflow process may be used to couple the integrated device 202 to the substrate 102. FIG. 4 illustrates an example of how the integrated device 202 may be coupled to the substrate 102.

Stage 2 also illustrates a state after at least one passive device (e.g., 205, 207, 209) is coupled to a second surface of the substrate 102 through a plurality of solder interconnects (e.g., 250, 270.290). A solder reflow process may be used to couple at least one passive device to the substrate 102.

Stage 3 illustrates a state after an encapsulation layer 208 is provided (e.g., formed) over the substrate 102. The encapsulation layer 208 may encapsulate the integrated device 202. The encapsulation layer 208 may include a mold, a resin and/or an epoxy. A compression molding process, a transfer molding process, or a liquid molding process may be used to form the encapsulation layer 208. The encapsulation layer 208 may be photo etchable. The encapsulation layer 208 may be a means for encapsulation.

Stage 4 illustrates a state after a plurality of solder interconnects 450 is coupled to the second surface of the substrate 102 through a solder reflow process. The plurality of solder interconnects 450 may be coupled to the plurality of interconnects 122.

Exemplary Flow Diagram of a Method for Fabricating a Package Comprising a Substrate, an Integrated Device and a Passive Device In some implementations, fabricating a package includes several processes. FIG. 8 illustrates an exemplary flow diagram of a method 800 for providing or fabricating a package comprising a substrate. In some implementations, the method 800 of FIG. 8 may be used to provide or fabricate the package 200 of FIG. 2 described in the disclosure. However, the method 800 may be used to provide or fabricate any of the packages described in the disclosure.

It should be noted that the method of FIG. 8 may combine one or more processes in order to simplify and/or clarify the method for providing or fabricating a package. In some implementations, the order of the processes may be changed or modified.

The method provides (at 1205) a substrate (e.g., 102). The substrate 102 may be provided by a supplier or fabricated. Different implementations may use different processes to fabricate the substrate 102. Examples of processes that may be used to fabricate a substrate include a semi-additive process (SAP) and a modified semi-additive process (mSAP). The substrate 102 includes the first dielectric layer 120, the second dielectric layer 130, the third dielectric layer 140, the solder resist layer 150, the solder resist layer 160 and a plurality of interconnects 122. The second dielectric layer 130 may include a different dielectric material from the first dielectric layer 120 and/or the third dielectric layer 140. The second dielectric layer 130 may be free of a glass material. The first dielectric layer 120 and/or the third dielectric layer 140 may include a glass material. FIGS. 5A-5D illustrate an example of fabricating a substrate. Stage 1 of FIG. 7 illustrates an example of a substrate that is provided.

The method may couple (at 810) an integrated device to a first surface of the substrate and at least one passive device to a second surface of the substrate. Stage 2 of FIG. 7, illustrates a state after the integrated device 202 is coupled to a first surface of the substrate 102 through the plurality of pillar interconnects 104 and a plurality of solder interconnects 106. A solder reflow process may be used to couple the integrated device 202 to the substrate 102. FIG. 4 illustrates an example of how the integrated device 202 may be coupled to the substrate 102.

Stage 2 also illustrates a state after at least one passive device (e.g., 205, 207, 209) is coupled to a second surface of the substrate 102 through a plurality of solder interconnects (e.g., 250, 270, 290). A solder reflow process may be used to couple the at least one passive device to the substrate 102.

The method forms (at 815) an encapsulation over the substrate and the integrated device. The encapsulation layer may be coupled to the substrate and the integrated device. Stage 3 of FIG. 7, illustrates a state after an encapsulation layer 208 is provided (e.g., formed) over the substrate 102. The encapsulation layer 208 may encapsulate the integrated device 202. The encapsulation layer 208 may include a mold, a resin and/or an epoxy. A compression molding process, a transfer molding process, or a liquid molding process may be used to form the encapsulation layer 208. The encapsulation layer 208 may be photo etchable. The encapsulation layer 208 may be a means for encapsulation.

The method couples (at 820) a plurality of solder interconnects to the second surface of the substrate 102. A solder reflow process may be used to couple the plurality of solder interconnects 450 to the substrate 102.

The packages (e.g., 200) described in the disclosure may be fabricated one at a time or may be fabricated together as part of one or more wafers and then singulated into individual packages.

Exemplary Electronic Devices

Figure 9:
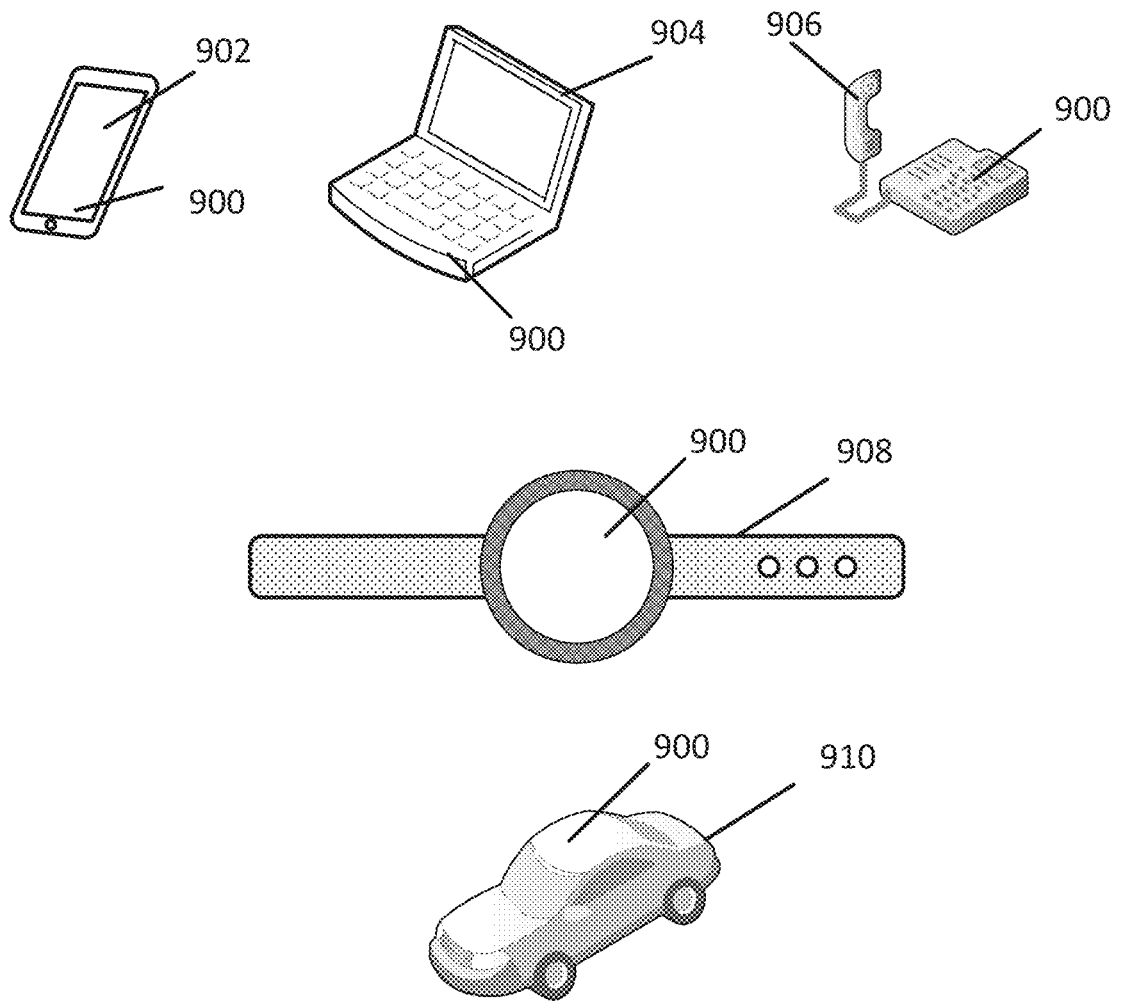
FIG. 9 illustrates various electronic devices that may integrate a die, an electronic circuit, an integrated device, an integrated passive device (IPD), a passive component, a package, and/or a device package described herein.

FIG. 9 illustrates various electronic devices that may be integrated with any of the aforementioned device, integrated device, integrated circuit (IC) package, integrated circuit (IC) device, semiconductor device, integrated circuit, die, interposer, package, package-on-package (PoP), System in Package (SiP), or System on Chip (SoC). For example, a mobile phone device 902, a laptop computer device 904, a fixed location terminal device 906, a wearable device 908, or automotive vehicle 910 may include a device 900 as described herein. The device 900 may be, for example, any of the devices and/or integrated circuit (IC packages described herein. The devices 902, 904, 906 and 908 and the vehicle 910 illustrated in FIG. 9 are merely exemplary. Other electronic devices may also feature the device 900 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 1-4, 5A-5D, and/or 6-9 may be rearranged and/or combined into a single component, process, feature or function or embodied in several components, processes, or functions. Additional elements, components, processes, and/or functions may also be added without departing from the disclosure. It should also be noted FIGS. 1-4, 5A-5D, and/or 6-9 and its corresponding description in the present disclosure is not limited to dies and/or ICs. In some implementations, FIGS. 1-4, 5A-5D, and/or 6-9 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another-even if they do not directly physically touch each other. An object A, that is coupled to an object B, may be coupled to at least part of object B. The term "electrically coupled" may mean that two objects are directly or indirectly coupled together such that an electrically current (e.g., signal, power, ground) may travel between the two objects. Two objects that are electrically coupled may or may not have an electrically current traveling between the two objects. The use of the terms "first", "second", "third" and "fourth" (and/or anything above fourth) is arbitrary. Any of the components described may be the first component, the second component, the third component or the fourth component. For example, a component that is referred to a second component, may be the first component, the second component, the third component or the fourth component. The terms "encapsulate", "encapsulating" and/or any derivation means that the object may partially encapsulate or completely encapsulate another object. The terms "top" and "bottom" are arbitrary. A component that is located on top may be located over a component that is located on a bottom. A top component may be considered a bottom component, and vice versa. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A first component that is located "in" a second component may be partially located in the second component or completely located in the second component. A value that is about X-XX, may mean a value that is between X and XX, inclusive of X and XX. The value(s) between X and XX may be discrete or continuous. The term "about 'value X'", or "approximately value X", as used in the disclosure means within 10 percent of the 'value X'. For example, a value of about 1 or approximately 1, would mean a value in a range of 0.9-1.1.

In some implementations, an interconnect is an element or component of a device or package that allows or facilitates an electrical connection between two points, elements and/or components. In some implementations, an interconnect may include a trace, a via, a pad, a pillar, a metallization layer, a redistribution layer, and/or an under bump metallization (UBM) layer/interconnect. In some implementations, an interconnect may include an electrically conductive material that may be configured to provide an electrical path for a signal (e.g., a data signal), ground and/or power. An interconnect may include more than one element or component. An interconnect may be defined by one or more interconnects. An interconnect may include one or more metal layers. An interconnect may be part of a circuit. Different implementations may use different processes and/or sequences for forming the interconnects. In some implementations, a chemical vapor deposition (CVD) process, a physical vapor deposition (PVD) process, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

In the following, further examples are described to facilitate the understanding of the disclosure.

Aspect 1: A package comprising a substrate that includes a first dielectric layer; a second dielectric layer; and a third dielectric layer. The second dielectric layer is located between the first dielectric layer and the third dielectric layer. The second dielectric layer includes a different material than the first dielectric layer and the third dielectric layer. The substrate includes a plurality of interconnects located in the first dielectric layer, the second dielectric layer and the third dielectric layer. The package includes an integrated device coupled to the substrate.

Aspect 2: The package of aspect 1, wherein the second dielectric layer is free of a glass material, and wherein the first dielectric layer and/or the third dielectric layer includes a glass material.

Aspect 3: The package of aspects 1 through 2, wherein the first dielectric layer and/or the third dielectric layer includes prepreg.

Aspect 4: The package of aspects 1 through 3, wherein the first dielectric layer includes a first thickness, and wherein the second dielectric layer includes a second thickness that is less than the first thickness.

Aspect 5: The package of aspect 4, wherein the plurality of interconnects comprises a first via interconnect located in the first dielectric layer, wherein the first via interconnect comprises a first via thickness; and a second via interconnect located in the second dielectric layer, wherein the second via interconnect comprises a second via thickness that is less than the first via thickness.

Aspect 6: The package of aspects 1 through 5, wherein the integrated device is coupled to a first surface of the substrate through a plurality of pillar interconnects and a plurality of solder interconnects.

Aspect 7: The package of aspect 6, further comprising an integrated passive device coupled to a second surface of the substrate, wherein the integrated passive device is coupled to two adjacent interconnects from the plurality of interconnects.

Aspect 8: The package of aspect 7, wherein the plurality of pillar interconnects includes two adjacent pillar interconnects that comprises a minimum pillar interconnect pitch, and wherein the two adjacent interconnects comprises a minimum pitch that is about the same as the minimum pillar interconnect pitch.

Aspect 9: The package of aspects 7 through 8, wherein the plurality of interconnects comprises a first plurality of interconnects that are arranged as a first column of interconnects that extend vertically through the entire substrate; and a second plurality of interconnects that are arranged as a second column of interconnects that extend vertically through the entire substrate, wherein the first column of interconnects is configured to provide a first electrical path between the integrated device and the integrated passive device, and wherein the second column of interconnects is configured to provide a second electrical path between the integrated device and the integrated passive device.

Aspect 10: The package of aspect 9, wherein the first column of interconnects is configured to be coupled to power, and wherein the second column of interconnects is configured to be coupled to ground.

Aspect 11: The package of aspects 9 through 10, wherein the first column of interconnects is adjacent to the second column of interconnects, and wherein the first column of interconnects and the second column of interconnects have a minimum pitch.

Aspect 12: The package of aspects 1 through 11, wherein the substrate is a coreless substrate that is free of a core layer.

Aspect 13: A substrate comprising a first dielectric layer; a second dielectric layer; a third dielectric layer, and a plurality of interconnects located in the first dielectric layer, the second dielectric layer and the third dielectric layer. The second dielectric layer is located between the first dielectric layer and the third dielectric layer. The second dielectric layer includes a different material than the first dielectric layer and the third dielectric layer.

Aspect 14: The substrate of aspect 13, wherein the second dielectric layer is free of a glass material, and wherein the first dielectric layer and/or the third dielectric layer includes a glass material.

Aspect 15: The substrate of aspects 13 through 14, wherein the first dielectric layer and/or the third dielectric layer includes prepreg.

Aspect 16: The substrate of aspects 13 through 15, wherein the first dielectric layer includes a first thickness, and wherein the second dielectric layer includes a second thickness that is less than the first thickness.

Aspect 17: The substrate of aspects 13 through 16, wherein the plurality of interconnects include a first column of interconnects and a second column of interconnects, wherein the first column of interconnects is adjacent to the second column of interconnects, and wherein the first column of interconnects and the second column of interconnects have a minimum pitch.

Aspect 18: The substrate of aspect 17, wherein each pair of interconnects from the first column of interconnects and the second column of interconnects include a same minimum pitch.

Aspect 19: The substrate of aspects 13 through 18, wherein the substrate is a coreless substrate that is free of a core layer.

Aspect 20: The substrate of aspects 13 through 19, wherein the substrate is implemented in a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

Aspect 21: A method for fabricating a package. The method provides a substrate comprising a first dielectric layer; a second dielectric layer; a third dielectric layer, and a plurality of interconnects located in the first dielectric layer, the second dielectric layer and the third dielectric layer. The second dielectric layer is located between the first dielectric layer and the third dielectric layer. The second dielectric layer includes a different material than the first dielectric layer and the third dielectric layer. The method couples an integrated device to the substrate.

Aspect 22: The method of aspect 21, wherein the second dielectric layer is free of a glass material, and wherein the first dielectric layer and/or the third dielectric layer includes a glass material.

Aspect 23: The method of aspects 21 through 22, wherein the first dielectric layer and/or the third dielectric layer includes prepreg.

Aspect 24: The method of aspects 21 through 23, wherein the first dielectric layer includes a first thickness, and wherein the second dielectric layer includes a second thickness that is less than the first thickness.

Aspect 25: The method of aspect 24, wherein the plurality of interconnects comprises a first via interconnect located in the first dielectric layer, wherein the first via interconnect comprises a first via thickness; and a second via interconnect located in the second dielectric layer, wherein the second via interconnect comprises a second via thickness that is less than the first via thickness.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

The invention claimed is:

1. A package comprising:
a substrate comprising:
    a first dielectric layer;
    a second dielectric layer; and
    a third dielectric layer, wherein the second dielectric layer is located between the first dielectric layer and the third dielectric layer,
    wherein the second dielectric layer includes a different material than the first dielectric layer and the third dielectric layer,
    wherein the second dielectric layer is free of a glass material, and
    wherein the first dielectric layer and the third dielectric layer includes a glass material; and
    a plurality of interconnects located in the first dielectric layer, the second dielectric layer and the third dielectric layer, wherein the first plurality of interconnects comprise a first column of interconnects and a second column of interconnects, and
an integrated device coupled to the substrate.

2. The package of claim 1, wherein the substrate is a coreless substrate that is free of a core layer.

3. The package of claim 1, wherein the first dielectric layer and/or the third dielectric layer includes prepreg.

4. The package of claim 1,
wherein the first dielectric layer includes a first thickness, and
wherein the second dielectric layer includes a second thickness that is less than the first thickness.

5. The package of claim 1,
wherein the first column of interconnects comprises:
    a first pad interconnect located in the first dielectric layer;
    a first via interconnect located in the first dielectric layer, wherein the first via interconnect is coupled to the first pad interconnect;
    a second pad interconnect located in the second dielectric layer, wherein the second pad interconnect is coupled to the first via interconnect;
    a second via interconnect located in the second dielectric layer, wherein the second via interconnect is coupled to the second pad interconnect;
    a third pad interconnect located in the third dielectric layer, wherein the third pad interconnect is coupled to the second via interconnect;
    a third via interconnect located in the third dielectric layer, wherein the third via interconnect is coupled to the third pad interconnect; and
    a fourth pad interconnect located on a surface of the third dielectric layer, wherein the fourth pad interconnect is coupled to the third pad interconnect,
wherein the second via interconnect has a diameter that is less than a diameter of the first via interconnect and/or a diameter of the third via interconnect, and
wherein the second column of interconnects comprises:
    another first pad interconnect located in the first dielectric layer;
    another first via interconnect located in the first dielectric layer, wherein the another first via interconnect is coupled to the another first pad interconnect;
    another second pad interconnect located in the second dielectric layer, wherein the another second pad interconnect is coupled to the another first via interconnect;
    another second via interconnect located in the second dielectric layer, wherein the another second via interconnect is coupled to the another second pad interconnect;

another third pad interconnect located in the third dielectric layer, wherein the another third pad interconnect is coupled to the another second via interconnect;

another third via interconnect located in the third dielectric layer, wherein the another third via interconnect is coupled to the another third pad interconnect; and another fourth pad interconnect located on a surface of the third dielectric layer, wherein the another fourth pad interconnect is coupled to the another third pad interconnect, wherein the another second via interconnect has a diameter that is less than a diameter of the another first via interconnect and/or a diameter of the another third via interconnect, and wherein the first column of interconnects is adjacent to the second column of interconnects.

6. The package of claim 5, wherein the integrated device is coupled to the first column of interconnects and the second column of interconnects of the substrate through a plurality of pillar interconnects and a plurality of solder interconnects.

7. The package of claim 6, further comprising an integrated passive device coupled to the first column of interconnects and the second column of interconnect of the substrate.

8. The package of claim 7, wherein the first pad interconnect, the second pad interconnect, the third pad interconnect and the fourth pad interconnect, each comprises a diameter of about 90 micrometers, wherein the first via interconnect, and the third via interconnect, each comprises a diameter of about 60 micrometers, and wherein the second via interconnect comprises a diameter of about 50 micrometers.

9. The package of claim 7, wherein the first column of interconnects is configured to provide a first electrical path between the integrated device and the integrated passive device, and wherein the second column of interconnects is configured to provide a second electrical path between the integrated device and the integrated passive device.

10. The package of claim 9, wherein the first column of interconnects is configured to be coupled to power, and wherein the second column of interconnects is configured to be coupled to ground.

11. The package of claim 9, wherein a spacing between the first pad interconnect and the another first pad interconnect is the same as a spacing between the second pad interconnect and the another second pad interconnect, and wherein the spacing between the first pad interconnect and the another first pad interconnect is the same as a spacing between the third pad interconnect and the another third pad interconnect.

12. The package of claim 1, wherein the substrate is an embedded trace substrate (ETS).

13. A substrate comprising:

a first dielectric layer;

a second dielectric layer;

a third dielectric layer, wherein the second dielectric layer is located between the first dielectric layer and the third dielectric layer,

wherein the second dielectric layer includes a different material than the first dielectric layer and the third dielectric layer;

wherein the second dielectric layer is free of a glass material, and wherein the first dielectric layer and the third dielectric layer includes a glass material, and a plurality of interconnects located in the first dielectric layer, the second dielectric layer and the third dielectric layer, wherein the plurality of interconnects comprises a first column of interconnects comprising:

a first pad interconnect located in the first dielectric layer;

a first via interconnect located in the first dielectric layer, wherein the first via interconnect is coupled to the first pad interconnect;

a second pad interconnect located in the second dielectric layer, wherein the second pad interconnect is coupled to the first via interconnect;

a second via interconnect located in the second dielectric layer, wherein the second via interconnect is coupled to the second pad interconnect;

a third pad interconnect located in the third dielectric layer, wherein the third pad interconnect is coupled to the second via interconnect;

a third via interconnect located in the third dielectric layer, wherein the third via interconnect is coupled to the third pad interconnect; and a fourth pad interconnect located on a surface of the third dielectric layer, wherein the fourth pad interconnect is coupled to the third pad interconnect, wherein the second via interconnect has a diameter that is less than a diameter of the first via interconnect and/or a diameter of the third via interconnect.

14. The substrate of claim 13, wherein the substrate is a coreless substrate that is free of a core layer.

15. The substrate of claim 13, wherein the first dielectric layer and/or the third dielectric layer includes prepreg.

16. The substrate of claim 13, wherein the first dielectric layer includes a first thickness, and wherein the second dielectric layer includes a second thickness that is less than the first thickness.

17. The substrate of claim 13, wherein the plurality of interconnects further comprise a second column of interconnects comprising:

another first pad interconnect located in the first dielectric layer;

another first via interconnect located in the first dielectric layer, wherein the another first via interconnect is coupled to the another first pad interconnect;

another second pad interconnect located in the second dielectric layer, wherein the another second pad interconnect is coupled to the another first via interconnect;

another second via interconnect located in the second dielectric layer, wherein the another second via interconnect is coupled to the another second pad interconnect;

another third pad interconnect located in the third dielectric layer, wherein the another third pad interconnect is coupled to the another second via interconnect;

another third via interconnect located in the third dielectric layer, wherein the another third via interconnect is coupled to the another third pad interconnect; and another fourth pad interconnect located on a surface of the third dielectric layer, wherein the another fourth pad interconnect is coupled to the another third pad interconnect, wherein the another second via interconnect has a diameter that is less than a diameter of the another first via interconnect and/or a diameter of the another third via interconnect, and wherein the first column of interconnects is adjacent to the second column of interconnects.

18. The substrate of claim 17, wherein a spacing between the first pad interconnect and the another first pad interconnect is the same as a spacing between the second pad interconnect and the another second pad interconnect, and wherein the spacing between the first pad interconnect and the another first pad interconnect is the same as a spacing between the third pad interconnect and the another third pad interconnect.

19. The substrate of claim 13, wherein the substrate is a an embedded trace substrate (ETS).

20. The substrate of claim 13, wherein the substrate is implemented in a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

21. A method for fabricating a package, comprising:

providing a substrate comprising:
a first dielectric layer;
a second dielectric layer;
a third dielectric layer,
wherein the second dielectric layer is located between the first dielectric layer and the third dielectric layer, and
wherein the second dielectric layer includes a different material than the first dielectric layer and the third dielectric layer,
wherein the second dielectric layer is free of a glass material, and
wherein the first dielectric layer and the third dielectric layer includes a glass material; and
a plurality of interconnects located in the first dielectric layer, the second dielectric layer and the third dielectric layer, wherein the plurality of interconnects comprises:

a first column of interconnects comprising:
a first pad interconnect located in the first dielectric layer;
a first via interconnect located in the first dielectric layer, wherein the first via interconnect is coupled to the first pad interconnect;
a second pad interconnect located in the second dielectric layer, wherein the second pad interconnect is coupled to the first via interconnect;
a second via interconnect located in the second dielectric layer, wherein the second via interconnect is coupled to the second pad interconnect;
a third pad interconnect located in the third dielectric layer, wherein the third pad interconnect is coupled to the second via interconnect;
a third via interconnect located in the third dielectric layer, wherein the third via interconnect is coupled to the third pad interconnect; and
a fourth pad interconnect located on a surface of the third dielectric layer,
wherein the fourth pad interconnect is coupled to the third pad interconnect,
wherein the second via interconnect has a diameter that is less than a diameter of the first via interconnect and/or a diameter of the third via interconnect, and
coupling an integrated device to the substrate.

22. The method of claim 21, wherein the substrate is a coreless substrate that is free of a core layer.

23. The method of claim 21, wherein the first dielectric layer and/or the third dielectric layer includes prepreg.

24. The method of claim 21, wherein the first dielectric layer includes a first thickness, and wherein the second dielectric layer includes a second thickness that is less than the first thickness.

25. The method of claim 24, wherein the plurality of interconnects comprises:

a first via interconnect located in the first dielectric layer, wherein the first via interconnect comprises a first via thickness; and a second via interconnect located in the second dielectric layer, wherein the second via interconnect comprises a second via thickness that is less than the first via thickness.

* * * * *